United States Patent [19]
Spence et al.

[11] Patent Number: 6,106,659
[45] Date of Patent: Aug. 22, 2000

[54] TREATER SYSTEMS AND METHODS FOR GENERATING MODERATE-TO-HIGH-PRESSURE PLASMA DISCHARGES FOR TREATING MATERIALS AND RELATED TREATED MATERIALS

[75] Inventors: Paul Spence, Knoxville, Tenn.; John Lynch, Laurel, Md.

[73] Assignee: The University of Tennessee Research Corporation, Knoxville, Tenn.

[21] Appl. No.: 08/947,716

[22] Filed: Oct. 9, 1997

Related U.S. Application Data

[60] Provisional application No. 60/052,417, Jul. 14, 1997.

[51] Int. Cl.[7] ........................................................ H05H 1/00
[52] U.S. Cl. ........................... 156/345; 118/723 E; 216/71
[58] Field of Search ..................... 156/345; 118/723 E, 118/718; 204/298.24; 427/575; 216/71

[56] References Cited

U.S. PATENT DOCUMENTS

| | | |
|---|---|---|
| 3,640,543 | 2/1972 | Main . |
| 3,814,983 | 6/1974 | Weissfloch et al. . |
| 4,153,560 | 5/1979 | Dinter et al. . |
| 4,301,765 | 11/1981 | Behn et al. . |
| 4,334,144 | 6/1982 | Ferrarini . |
| 4,457,145 | 7/1984 | Sando et al. . |
| 4,501,428 | 2/1985 | Ueno et al. . |
| 4,551,310 | 11/1985 | Imada et al. . |
| 4,803,332 | 2/1989 | Koyama et al. . |
| 4,808,258 | 2/1989 | Otsubo et al. ........................... 156/345 |
| 4,937,094 | 6/1990 | Doehler et al. . |
| 5,215,636 | 6/1993 | Danilychev et al. . |
| 5,224,441 | 7/1993 | Felts et al. ............................... 118/718 |
| 5,300,189 | 4/1994 | Kokaku et al. . |
| 5,314,539 | 5/1994 | Brown et al. . |
| 5,368,685 | 11/1994 | Kumihashi et al. ..................... 156/345 |
| 5,371,649 | 12/1994 | Iwata et al. . |
| 5,391,855 | 2/1995 | Tanisaki et al. . |
| 5,407,446 | 4/1995 | Sando et al. . |
| 5,437,725 | 8/1995 | Schuster et al. . |
| 5,458,856 | 10/1995 | Marie et al. . |
| 5,520,740 | 5/1996 | Kanai et al. . |
| 5,523,124 | 6/1996 | Slootman et al. . |
| 5,527,629 | 6/1996 | Gastiger et al. . |
| 5,529,631 | 6/1996 | Yoshikawa et al. . |
| 5,558,843 | 9/1996 | Glocker et al. . |
| 5,571,749 | 11/1996 | Matsuda et al. . |
| 5,576,076 | 11/1996 | Slootman et al. . |
| 5,652,029 | 7/1997 | Itoh ...................................... 118/723 E |
| 5,669,583 | 9/1997 | Roth . |

FOREIGN PATENT DOCUMENTS

| | | |
|---|---|---|
| 42 33 895 | 4/1994 | Germany . |
| 787 403 | 12/1957 | United Kingdom . |
| 997093 | 6/1965 | United Kingdom . |

OTHER PUBLICATIONS

"Industrial Plasma Engineering", J. Reece Roth, vol. 1, Institute of Physics Publishing, Philadelphia, 1995, pp. 148–151.

(List continued on next page.)

*Primary Examiner*—Thi Dang
*Attorney, Agent, or Firm*—Steve Mendelsohn

[57] ABSTRACT

Continuous-feed plasma treater systems are designed to treat continuous substrates, such as webs or films, by continuously feeding the substrates through an enclosure having a plasma discharge that alters the substrate's surface properties in some desirable fashion. According to the present invention, the enclosure has one or more electrode assemblies that generate plasma discharges at working-gas pressures ranging from moderate pressures (e.g., rough vacuums as low as about 10 Torr) to high pressures (e.g., about one Atmosphere). The electrode assemblies are driven by power supplies that excite the electrode assemblies in either an RF resonant excitation mode or a pulsed voltage excitation mode. By operating in the moderate, rough-vacuum pressure range, plasma treater systems of the present invention can be used (a) to treat substrates in an efficient cost-effective manner and (b) to produce treated substrates having superior surface properties as compared to those generated using prior-art systems, such as corona-type discharge systems operating at either low pressures (i.e., <1 Torr) or high pressures.

67 Claims, 26 Drawing Sheets

OTHER PUBLICATIONS

"Conductively Cooled Capacitively Coupled RF Excited $CO_2$ Lasers", by S. Yatsiv, The Hebrew University and Alumor Lasers Ltd., Jerusalem, Israel, 1986, pp. 252–257.

"RF Excited $CO_2$ Lasers", by H. Hügel, Universität Stuttgart, Institut für Strahlwerkzeuge, Fed. Rep. of Germany, 1986, pp. 258–264.

"Plasma Surface Modification and Plasma Polymerization", by N. Inagaki, Ph.D., Technomic Publishing Co., Inc. 1996, pp. 43–63.

"Principles of Plasma Discharges and Materials Processing", by Michael A. Lieberman and Allan J. Lichtenberg, A Wiley–Interscience Publication John Wiley & Sons, Inc., McGraw–Hill 1994, pp. 497–503.

"CW Carbon Monoxide Laser With RF Excitation in the Supersonic Flow", by W. Schock, W. Schall, H. Hügel, and P. Hoffmann, Appl. Phys. Lett. 36(1), May 15, 1980 American Institute of Physics, pp. 793–794.

"High–Pressure Laser Action in 13 Gases With Transverse Excitation", by O.R. Wood, E.G. Burkhardt, M.A. Pollack, and T.J. Bridges, Applied Physics Letters, vol. 18, No. 4, Feb. 15, 1971, pp. 112–115.

"$N_2O$ Formation in Ozonizers", by B. Eliasson and U. Kogelschatz, Journal de chimie physique, 1986, 83, No. 4, 4 pages.

"Mechanism of Ozone Generation in Air–Fed Ozonisers", by S. Yagi and M. Tanaka, J. Phys. D: Appl. Phys., vol. 12, 1979, pp. 1509–1520.

"Laser Gain Characterization of Near–Atmospheric $CO_2:N_2$:He Glows in a Planar Electrode Geometry", L.J. Denes and L.A. Weaver, J. Appl. Phys., vol. 44, No. 9, Sep. 1973, pp. 4125–4136.

"Changes in Surface Properties of Poly(Ethylene Terephthalate) Treated With Low Temperature Plasma:Effect of Pretreatment With Dimethylformamide", by Tomiji Wakida et al., Sen–I Gakkaishi, vol. 42, No. 2 (1986), pp. T69–T73.

"Interactive Wall Turbulence Control", by Stephen P. Wilkinson, vol. 123 of Progress in Astronautics and Aeronautics, AIAA, Washington, DC, ISBN 0–930403–66–5, 1990, pp. 479–509.

"Oxidation of Polyethylene Surfaces by Remote Plasma Discharge: A Comparison Study with Alternative Oxidation Methods", by Renate Foerch et al., Journal of Polymer Science: Part A: Polymer Chemistry, vol. 28, pp. 193–204 (1990).

"Plasma modification of polymer surfaces for adhesion improvement", by F.D. Egitto and L.J. Matienzo, IBM J. Res. Develop., vol. 38, No. 4, Jul. 1994, pp. 423–439.

"Surface Modification of Polypropylene in an Impulse Corona Discharge", by Sung–Won Kim, Korean J. of Chem. Eng., 13(1), pp. 97–100 (1996).

"Wettability control of a plastic surface by $CF_4$–$O_2$ plasma and its etching effect", by. M. Kogoma et al., Letter to the Editor, 1987 IOP Publishing Ltd., pp. 147–149.

Table 1

INK ADHESION FOR A POLYETHYLENE-BASED FILM WITH A HIGH AMOUNT OF AMIDE WAX PRINTED AFTER VARIOUS TREATMENT CONDITIONS AND THEN TESTED WITH 3M 810 TAPE.

| treater | $CF_4:O_2$ (vol/vol) | flow rates $O_2/CF_4/He$ (lpm) | power density (W/cm³) | electrode temp. (°C) | mean field strength (kV/cm) | pressure (Torr) | treat time (sec) | slow tape removal (% left) | fast tape removal (% left) |
|---|---|---|---|---|---|---|---|---|---|
| none | – | – | – | – | – | – | – | 0 | 0 |
| CDT | AIR | – | 55 | – | – | 760 | 2 | 90 | 40 |
| LPP | 4 | – | 0.05 | – | – | 0.5 | 20 | 0 | 0 |
| HPP | 7.5 | 0.12/0.9/0.0 | 8.6 | 40 | – | 100 | 2 | 30 | 0 |
| HPP | 3.6 | 0.23/0.83/0.0 | 10 | 40 | 3.0 | 100 | 2 | 50 | 10 |
| HPP | 1.8 | 0.46/0.83/0.0 | 14 | 43 | – | 100 | 2 | 100 | 100 |
| HPP | 3 | 0.2/0.6/67 | 32 | 16 | 4.8 | 760 | 1 | 100 | 50 |
| HPP | 3 | 0.2/0.6/67 | 32 | 16 | 4.8 | 760 | 2 | 100 | 100 |
| HPP | 0 | 0.24/0/49 | 26 | 16 | 4.8 | 760 | 1 | 100 | 50 |
| HPP | 0 | 0.24/0/49 | 26 | 16 | 4.8 | 760 | 2 | 100 | 100 |

CDT = TREATMENTS PERFORMED WITH A COMMERCIAL BARE ROLL CORONA TREATER.
LPP = TREATMENTS PERFORMED WITH A COMMERCIAL LOW PRESSURE PLASMA UNIT.
HPP = TREATMENTS PERFORMED WITH ALUMINUM SLEEVE, RESONANT RF HIGH PRESSURE PLASMA.

Table 2.

INK ADHESION FOR A POLYETHYLENE-BASED FILMS WITH HIGH AMOUNT OF ADDITIVES PRINTED AFTER EITHER CDT OR HPP AND THEN TESTED WITH 3M 810 TAPE.

| additive | treater | $CF_4:O_2$ (vol/vol) | flow rates $O_2/CF_4/He$ (lpm) | power density (W/cm³) | electrode temp. (°C) | mean field strength (kV/cm) | pressure (Torr) | treat time (sec) | fast tape removal (% left) |
|---|---|---|---|---|---|---|---|---|---|
| amide wax | CDT | AIR | — | 55 | — | — | 760 | 2 | <15 |
| amide wax | HPP | 1.8 | 0.46/0.83 | 14 | 43 | — | 100 | 2 | 90 |
| antifog agent | CDT | AIR | — | 55 | — | — | 760 | 2 | 40 |
| antifog agent | HPP | 2.7 | 0.3/0.8 | 4.1 | — | — | 56 | 1.5 | 100 |
| silicone release | CDT | AIR | — | 55 | — | — | 760 | 2 | 90 |
| silicone release | HPP | 2 | 0.5/1.0 | 6.6 | — | — | 56 | 1.5 | 100 |

CDT = TREATMENTS PERFORMED WITH A COMMERCIAL BARE ROLL CORONA TREATER.
HPP = TREATMENTS PERFORMED WITH ALUMINUM SLEEVE, RESONANT RF HIGH PRESSURE PLASMA.

| MATERIAL: LAMINATION TESTS: PET-PE, EVA-PET, EVA-EVA |||||||||||
| ELECTRODE CONFIGURATION: PARALLEL ARRANGEMENT OF TWO ALUMINUM SLEEVE – DIELECTRIC CYLINDER TREATERS, TREATED FILMS MERGED AND WOUND TOGETHER. |||||||||||
| DISCHARGE TECNIQUE: RESONANT RF @ 13.56 MHz AND ASYMMETRIC PULSE DISCHARGE SIMULTANEOUS ON SEPARATE TREATER HEADS, 2mm SPACING |||||||||||

| SAMPLE NUMBER | TREATMENT TIME seconds | SUPPLY GASES | SUPPLY GAS FLOW RATES (LPM) | ELECTRODE FLOW RATES(LPM) upper,lower | SUPPLY GAS, ELECTRODE TEMPERATURE °C | MEAN FIELD STRENGTH kV/cm | POWER DENSITY watts/cm | CHAMBER PRESSURE TORR | COMMENT |
|---|---|---|---|---|---|---|---|---|---|
| PET-PE | 3 | $CO_2, O_2, He, CF_4$ | 0.9,0.3, 0.8,0.03 | 2,0 | 38 | | | 56 | TREATED IN SERIES |
| SET I,5,4 | 6,3 | $N_2O, O_2, He$ | 0.2,0.07,3 | 3.2,0 | 38 | 3.2 | 9.5 | 56 | EVA TREATED LAMINATED PET |
| SET II, 4 (PET) 3 | 3 | $He, CF_4$ | 2.4,0.03 | 2.4,0 | 40 | 3.2 | 7.0 | 56 | PET TREATED AND LAMINATED TO UNTREATED EVA |
| | 3 | $He, CF_4$ | 3.0,0.04 | 3.0,0 | 40 | 3.2 | 7.0 | 56 | |
| 2 | 3 | $He, C_2F_6$ | 2.0,0.17 | 2.2,0 | 40 | 3.2 | 11 | 56 | |
| PET EVA | 3 | $N_2/NO$ | 2.0 | 2.0,0 | 38 | 3.2 $V_s=1kV$ @ 10kHz PRR | 6.6 | 76 | |
| EVA EVA | 6 | $N_2/NO$ | 2.0 | 2.0,0 | 40 | 3.4 | 11 | 76 | |
| EVA EVA | 0.75/1.5 | Ar Ar | 1.9 0.2 | 1.9,0 0.2,0 | 40 | 2.2 $V_s=1kV$ @ 10kHz PRR $V_s=0.8kV$@10kHz PRR | 5.2 | 76 | |
| PE PET | 0.75/1.5 | $N_2/NO$ | 2.0 | 2.0,0 2.0,0 | 40 | 3.2 $V_s=0.8kV$@10kHz PRR | 7.2 | 76 | |
| PE PET | 0.75/1.5 | $N_2/NO$ | 2.0 | 2.0,0 2.0,0 | 40 | 4.1 $V_s=0.8kV$@10kHz PRR | 14 | 76 | |

Table 3

Table 4

| POLYMER | EXPOSURE TIME (seconds) | PLASMA[1] TREATMENT GAS | GAS FLOW RATES LITERS/min | SURFACE[2] DOSAGE J/cm2 | SYSTEM PRESSURE TORR | DRY ADHESION STRENGTH lb/in | WET ADHESION STRENGTH lb/in |
|---|---|---|---|---|---|---|---|
| PE (0%EVA) | 0.75 | $N_2$/NO | 1.6 | 0.7 | 56 | >7.5 | 2.2, 0.7, 0.9 |
|  | 1.5 |  |  | 1.5 |  | >7.5 | 0.0 |
| PE (3%EVA) | 0.75 | $N_2$/NO | 1.6 | 0.6 | 56 | >8.0 | 3.8, 3.7, 0.03 |
|  | 1.5 |  |  | 1.2 |  | >8.0 | 0.4 |
| PE (9%EVA) | 0.75 | $N_2$/NO | 1.6 | 0.7 | 56 | >8.3 | >8.3, 3.0 |
|  | 1.5 |  |  | 1.4 |  | >8.3 | 0.7, 0.2, 0.1 |
| PE (18%EVA) | 0.75 | $N_2$/NO | 1.6 | 0.9 | 56 | 2.0 | >8.3 |
|  | 1.5 |  |  | 1.8 |  | 1.2 | 0.01, 0.2 |

NOTE:  1. SUPPLY GAS IS 1% NO AND PREMIXED.
2. SURFACE DOSAGE=POWER DENSITY · EXPOSURE TIME · DISCHARGE GAP.
3. BASE POLYMER IS POLYETHYLENE. ETHYLENE VINYL ACETATE IS COATED ON ONE SIDE WHICH IS THEN PLASMA TREATED.

Table 5

| POLYMER FILM | EXPOSURE TIME (seconds) | PLASMA TREATMENT GAS | GAS FLOW RATES LITERS/min | POWER[1] DENSITY watts/cm | MEAN FIELD STRENGTH kV/cm | SYSTEM PRESSURE TORR | ADVANCING CONTACT ANGLE FOR WATER[2] DEGREES |
|---|---|---|---|---|---|---|---|
| PE | 0.8 | He, $CF_4$ | 19, 0.17 | 65 | 20 | 760 | 113 |
|  | 1.5 |  |  |  |  |  | 113 |
|  | 3.0 |  |  |  |  |  | 114 |
|  | 6.0 |  |  |  |  |  | 114 |
| PE | 1 | He, $C_2F_6$ | 27, 0.1 | 96 | 18 | 760 | 108 |
|  | 3 |  |  |  |  |  | 118 |
|  | 7.5 |  |  |  |  |  | 117 |

NOTE: 1. DISCHARGE IS 13.56MHz RF RESONANT EXCITATION.
2. REFERENCE CONTACT ANGLE FOR UNTREATED POLYETHYLENE IS 98 DEGREES.

Table 6

| POLYMER FILM | EXPOSURE TIME (seconds) | REMOTE PLASMA TREATMENT GAS[1] | TREATMENT GAS FLOW LITERS/min milligr/sec | REMOTE PLASMA DISCHARGE POWER DENSITY[3] (Watts/cc) | DIRECT PLASMA PRETREATMENT GAS | PRETREAT GAS FLOW liters/min | PRETREAT POWER DENSITY watts/cc | SYSTEM PRESSURE TORR | CONTACT ANGLE degrees (water) | ANTIFOG | %O | %N | %S |
|---|---|---|---|---|---|---|---|---|---|---|---|---|---|
| PE | 1 | $SO_2$, $O_2$ AA | 0.9, 0.3, 7.5 | 9.3 | $CO_2$ | 0.9 | 1 | 56 | 68 | 2.5 | 18.3 | 2.5 | 8.4 |
|  | 2 |  |  |  |  |  |  |  | 58 | 3.5 | 19.9 | 0.9 | 12.2 |
|  | 5 |  |  |  |  |  |  |  | 40 | 3.5 | 20.0 | 0.4 | 13.3 |
|  | 10 |  |  |  |  |  |  |  | 43 | 3.5 | 23.6 | 1.1 | 9.0 |
| PE | 2 | $CO_2$, AA[2] | 1.1, 8.6 | 7.8 | $N_2O$, $O_2$ | 0.2 | 0.5 | 56 | 47 | 1.5 | 21.4 | 2.1 | — |
|  | 5 |  |  |  |  |  |  |  | 48 | 2.0-2.5 | 22.4 | 3.3 | 0.4 |

NOTE: 1. AA IS ACRYLIC ACID WITH STABILIZER. SUPPLY GASES FOR REMOTE PLASMA TREATMENT FLOWS OVER ACRYLIC ACID RESERVOIR.
2. REMOTE PLASMA GENERATED BY RESONANT RF DISCHARGE, PRETREATMENT PLASMA WITH ASYMMETRIC PULSED VOLTAGE AT 45kHz.
3. POWER DENSITY FOR REMOTE PLASMA DISCHARGE IS THE POWER DENSITY INSIDE CAVITY ELECTRODE.

Table 7

| POLYMER | EXPOSURE TIME (seconds) | PLASMA TREATMENT GAS[1] | GAS FLOW RATES liters/min | POWER DENSITY watts/cc | SYSTEM PRESSURE TORR | ADVANCING WATER CONTACT ANGLE (degrees) | ANTIFOG 4hr | ANTIFOG 1 day | %O | %Si | %Cl | %N |
|---|---|---|---|---|---|---|---|---|---|---|---|---|
| PE | 0.25 | N$_2$ N$_2$O (He+SiCl$_4$) | 1.2 1.0 (1.7+0.4) | 8.7 | 51 | ≤30 | 3.5 | 3.5 | 49 | 20 | 3 | 0 |
| PE | 0.38 | | | | | ≤30 | 3.0 | 3.0 | 46 | 21 | 2 | 0 |
| PE | 0.75 | | | | | ≤30 | 3.0 | 3.0 | 52 | 24 | 1 | 0 |
| PE | 0.25 | CO$_2$ SiCl$_4$ | 1.3 0.4 | 10.6 | 51 | ≤30 | 3.0 | 3.0 | 32 | 12 | 1 | 0 |
| PE | 0.38 | | | | | ≤30 | 3.0 | 3.3 | 45 | 18 | 4 | 1 |
| PE | 0.75 | | | | | ≤30 | 3.5 | 3.5 | 42 | 21 | 6 | 0 |

NOTE: 1. FOR CASE 1, HELIUM GAS FLOWS OVER SILICON TETRACHLORIDE.

Table 8

| POLYMER | EXPOSURE TIME (seconds) | PLASMA TREATMENT GAS | GAS FLOW RATES liters/min | POWER DENSITY watts/cc | SYSTEM PRESSURE TORR | ADVANCING WATER CONTACT ANGLE (degrees) | ANTIFOG 4hr | ANTIFOG 1 day | %O | %Si | %Cl | %N |
|---|---|---|---|---|---|---|---|---|---|---|---|---|
| PE | 0.19 | N$_2$ CO$_2$ SiCl$_2$H$_2$ | 1.9 0.2 0.13 | 8.1 | 51 | ≤30 | 3.0 | 3.0 | 42 | 14 | 3 | 1 |
| PE | 0.38 | | | | | ≤30 | 3.0 | 3.0 | 49 | 18 | 2 | 1 |
| PE | 0.75 | | | | | ≤30 | 3.5 | 3.8 | 51 | 19 | 3 | 1 |

Table 9

| SAMPLE | SUPPLY GAS[1] | SUPPLY GAS FLOW RATES LPM | TREATMENT DOSAGE joules/cm[3] | SAMPLE WETTING AFTER 5 WEEKS 0.1/0.5/5.0 sec. | RINSED SAMPLE WETTING AFTER 5 WEEKS: 0.1/0.5/5.0 |
|---|---|---|---|---|---|
| SET III:5 | $N_2/NO$<br>$SiCl_2H_2$ | 2.7<br>0.07 | 52.8 | 10/10/10 | 10/10/10 |
| SET IV:5 | $N_2O$<br>$SiCl_2H_2$ | 1.8<br>0.1 | 63.6 | 10/10/10 | 2/9/10 |
| 1 | $N_2/NO,He$<br>$SiCl_4$ | 1.1, 6.3<br>~0.1 | 15.6 | 10/10/10 | 10/10/10 |
| 2 | $N_2/NO,O_2$<br>$SiCl_4$ | 2.4 0.3<br>~0.1 | 15.6 | 10/10/10 | 10/10/10 |
| 3 | $N_2/NO,He$<br>$SiCl_4$ | 1.1 9.8<br>~0.1 | 15.6 | 10/10/10 | 10/10/10 |

NOTES: 1. THE $N_2O$ IS PREMIXED AND 1% BY VOLUME NO.
2. FLOW RATES ARE IN LITERS PER MINUTE FOR 13cm x 7.6cm TREATMENT ZONE.
3. WETTING TIME FOR DROP TO COMPLETELY ABSORB INTO WEB.

Table 10

| SAMPLE | SUPPLY GAS [1] | SUPPLY GAS FLOW RATES [2] LPM | TREATMENT DOSAGE joules/cm³ | WASHED 3/30/97 TESTED 3/31/97 [3] SECONDS | WASHED 7/7/97 TESTED 7/8/97 [3] SECONDS |
|---|---|---|---|---|---|
| 1 | $SO_2, N_2+NO, O_2$ | 1, 1.5, 0.1 | 17.4 | <10 | ~60 |
| 2 | $SO_2, N_2+NO, O_2$ | 1, 1, 0.1 | 17.4 | <10 | ~60 |
| 3 | $SO_2, N_2+NO$ | 1, 1 | 18.9 | <10 | ~180 |
| 4 | $SO_2, N_2+NO$ | 1, 1 | 21 | <10 | ~180 |
| 5 | $SO_2, N_2+NO$ | 0.7, 1.2 | 63 | <30 | ~180 |

NOTES: 1. THE $N_2+NO$ IS PREMIXED AND 1% BY VOLUME NO.
2. FLOW RATES ARE IN LITERS PER MINUTE FOR 13cm x 7.6cm TREATMENT ZONE.
3. WETTING TIME FOR DROP TO COMPLETELY ABSORB INTO WEB.

| PARAMETERS | CORONA DISCHARGE | DIELECTRIC BARRIER | RF CAPACITIVELY COUPLED | REMOTE RF DISCHARGE |
|---|---|---|---|---|
| ELECTRODE GEOMETRY | POINT OR CURVED ELECTRODE WITH OR WITHOUT COVERING ON GROUNDED SURFACE. ELECTRODE GEOMETRY OFTEN POORLY DEFINED. | PARALLEL PLATE OR COAXIAL GEOMETRY. DIELECTRIC BARRIER ON ONE OR BOTH ELECTRODES REQUIRED. | PARALLEL PLATE OR COAXIAL GEOMETRY WITH OR WITHOUT DIELECTRIC BARRIER ON ONE OR BOTH ELECTRODES. MORE VERSATILE WITH. | REQUIRES TWO DISTINCT DISCHARGE REGIONS WITH GAS FLOW BETWEEN. CAN BE EITHER PLANAR OR COAXIAL. |
| ELECTRIC FIELD | 0.5 TO 100kV/cm VARIABLE AND NONUNIFORM. | 0.1 TO 100kV/cm, SPATIALLY UNIFORM EXCEPT NEAR CURVED EDGES. | 0.2 TO 40kV/cm AND UNIFORM EXCEPT NEAR ELECTRODE EDGES AND WITH LARGE CURRENTS. | SIMILAR TO RF CAPACITIVE FOR PLASMA PRODUCTION. WEAK TO NO FIELD IN TREATMENT ZONE. |
| EXCITATION VOLTAGE | DC TO MHz FREQUENCIES. COMMERCIAL TREATERS RANGE FROM 1 TO 100kHz SINUSOIDAL @ 500 TO 50kV. | STRICTLY AC. COMMERCIAL TREATERS RANGE 1 TO 100kHz SINUSOIDAL AND SYMMETRIC SQUARE WAVE. UTK-ASYMMETRIC PULSE. | 1 TO 30 MHz SINUSOIDAL, BALANCED VOLTAGE WITH CIRCUIT TUNED FOR RESONANCE, Q~4. SIGNAL 2–10kV rms | SIMILAR TO RF CAPACITIVE IN PRODUCTION ZONE. PULSE OR DC BIAS POSSIBLE IN TREAT ZONE, 0 TO 5kV/cm. |
| ELECTRON ENERGY | ~5eV-VARIABLE | 1–10eV. | 1–20eV | 0.1 TO 5eV, UNIFORM, VARIABLE. |
| ELECTRON DENSITY | $10^8 - 10^{11}$ #/cm$^3$ | $10^9 - 10^{11}$ #/cm$^3$ UNIFORM MODE. ~$10^{14}$/cm$^3$ FILAMENTARY MODE. | $10^9 - 10^{13}$ #/cm$^3$ UNIFORM MODE. >$10^{14}$/cm$^3$ FILAMENTARY, ARC MODE. | $10^9 - 10^{13}$ #/cm$^3$ SOURCE ZONE. LOW TO ~$10^7$ #/cm$^3$ TREAT ZONE. |
| POWER DENSITY | 0.2 TO 5 watts/cm$^3$ SPATIALLY VARIABLE. | 0.05 TO 20 watts/cm$^3$ PULSED VOLTAGE YIELDS HIGHER DENSITIES | 5 TO 200 watts/cm$^3$ | 5 TO 200 watts/cm$^3$ SOURCE. |
| DUTY CYCLE | 1% TO 20% AC, HIGHER FOR DC | 1% TO 20%. | ~100% TYPICALLY. | ~100% TYPICALLY. |
| SUBSTRATE BOMBARDMENT | MODERATE TO WEAK UNLESS STRONG FILAMENTS PRESENTS. | HEAVY IN FILAMENTARY MODE. BIASED WITH ASYMMETRIC VOLTAGE | HEAVY DUE TO LARGE VOLTAGE DROP ACROSS PLASMA SHEATH. | HIGH FLUX, LOW ENERGY ON SUBSTRATE, BIAS/FLOW CONTROLLED |
| SUBSTRATE/GAS HEATING | LOW | MODERATE TO HEAVY. | HEAVY DUE TO COLLISIONAL HEATING IN SHEATH. REQUIRES SUBSTRATE COOLING. | MODERATE TO LOW. |
| GAS ACCEPTANCE | BROAD RANGE OF GASES POSSIBLE. AIR COMMON. POSITIVE DC BIAS GIVES MORE UNIFORM DISCHARGE. | ROBUST, FROM PURE HELIUM TO PURE OXYGEN. FILAMENTARY DISCHARGE MORE PRONE WITH RAMSAUR GASES. | LIMITED TO INERT GASES AND SEVERAL PERCENT $O_2$, $CO_2$ FOR LOW POWER, P=atm. ELECTRONEGATIVE GASES ARE DIFFICULT DUE TO DISCHARGE RELYING ON SECONDARY ELECTRONS. O.K. FOR ESSENTIALLY ANY GAS AT P $\leq$ 150Torr. | SIMILAR TO RF CAPACITIVELY COUPLED EXCEPT HIGHER $O_2$ AND $CO_2$ LEVELS ALLOWED FOR P=atm. |

Table 11

TREATER SYSTEMS AND METHODS FOR GENERATING MODERATE-TO-HIGH-PRESSURE PLASMA DISCHARGES FOR TREATING MATERIALS AND RELATED TREATED MATERIALS

This nonprovisional U.S. national application, filed under 35 U.S.C. § 111(a), claims, under 35 U.S.C. § 119(e)(1), the benefit of the filing date of provisional U.S. national application no. 60/052,417, filed under 35 U.S.C. § 111(b) on Jul. 14, 1997, the teachings of which are incorporated herein by reference.

This application is related to allowed U.S. patent application Ser. No 08/719,588, filed Sep. 25, 1996, now U.S. Pat. No. 5,895,558 which is a continuation of U.S. patent application Ser. No. 08/492,193, filed Jun. 19, 1995, now abandoned, the teachings of both of which are incorporated herein by reference.

BACKGROUND OF THE INVENTION

1. Field of the Invention

The present invention relates to electrode designs, excitation methods, and process conditions for the in-line, continuous treatment of flexible webs and films for improved surface properties, and to the resulting films and webs having modified surface properties.

2. Description of the Related Art

The applications and demands for improved surface modifications of polymer films and webs have grown considerably in the past ten years. Increasing environmental concerns are imposing tighter restrictions on the levels of solvents, adhesives, and surfactants often used with polymer films and webs. Plasma surface treatment offers an alternative to the use of these chemicals as well as polymer additives and the caustic chemical treatments often used for the modification of polymer surfaces. For many industrial applications, high speed in-line treatment of a film or web substrate is the desired objective. Treater equipment having small floor signature and the capability of being interfaced to existing production line equipment is often a necessity.

The high-volume plasma treatment of polymer webs or films has traditionally been done using either corona treatment at atmospheric pressure or low-pressure ($P \leq 1$ Torr) discharges in batch mode operation. Conventional corona treatment using air has been around for at least 40 years and provides an economical but limited technique for surface modification. Altering the working gas of a corona treater provides a first step in expanding the utility of conventional corona discharge technology. Commercial corona treaters typically operate using low-frequency sinusoidal or half-sine-wave excitation in the frequency range of 60 Hz to 30 kHz. The electrode designs and excitation methods used tend to limit the discharge power densities and duty cycles attainable.

U.S. Pat. No. 5,576,076 by Slootman et al. discloses a process for depositing a layer of silicon oxide on a traveling substrate using silane gases at high pressures, typically atmospheric pressure. The electrode structure is designed so that an inert gas (preferably nitrogen) is introduced upstream of a moving substrate. By using a combination of suction and sufficient inert gas inlet flow, the introduction of ambient air into a discharge region can be controlled. A small amount of a silane gas and oxidizer along with an inert buffer gas are introduced into a corona-type discharge zone. Bar-type electrodes are excited using a sinusoidal signal at frequencies up to 60 kHz. The discharge is typically operated in a filamentary mode, requiring a dielectric barrier on the bar electrodes. The process yields surface treatments considerably improved over conventional corona treatments in terms of increased hydrophilicity and lamination strength. The process as disclosed however uses significant amounts of the inert buffer gas. The hydride silane ($SiH_4$) and an oxidant are the preferred functionalizing gases and are about 1% to about 4% of the inert gas. Special precautions must be taken in gas handling since this silane is pyrophoric and expensive.

U.S. Pat. No. 5,527,629 by Gastinger et al. is a process patent similar to U.S. Pat. No. 5,576,076 with the added step of introducing a silane gas concomitantly or after plasma treatment. A low-frequency (20 kHz) dielectric-barrier corona-type discharge is also employed. Both of these treatment processes could benefit from the use of a more uniform plasma to produce improved surface uniformity, and reduced-pressure operation to decrease gas consumption.

Low-pressure systems, which typically operate around 1 Torr or less, have the versatility of using essentially any gas or volatile substance as a plasma medium; however, not all low pressure discharge methods scale well or are capable of generating a high-power-density discharge. In order to avoid some of the process restrictions of low-pressure batch processes, some recent applications of low-pressure discharges utilize annular gaps with differential pumping or roller seals to generate a vacuum interface. These low-pressure continuous-feed systems typically operate at or below 1 Torr, require multistage vacuum pumping and utilize a diffuse, low-power-density discharge for surface modification.

U.S. Pat. No. 5,314,539 by Brown et al. discloses an apparatus using multiple roller seals to generate a pressure interface and introduce a continuous strip of photographic substrate or similar material into a reduced-pressure ($P \leq 1$ Torr) region for plasma treatment. A low-power RF discharge is used with air to modify the polymer substrate for improved wettability. The low discharge current of 20 to 200 milliamps for a 12.7-cm wide film suggests that a diffuse, low-power-density glow discharge is generated. The electrode shapes employed also require the low-pressure ($P \leq 1$ Torr) operation. The sharp contours or bar shapes of the electrodes employed require that a discharge be ignited at modest voltages. Attempts to increase the discharge power density by significant increases in the discharge voltage would most likely result in plasma streamers and a poorly defined discharge. Because of the required low-pressure operation, multiple roller-seal stages are required, complicating the device's construction and maintenance.

U.S. Pat. No. 5,529,631 by Yoshikawa et al. discloses an apparatus using roller or gap seals to introduce a continuous sheet-like material into a high-pressure plasma treatment zone. The discharge is operated at essentially atmospheric pressure with helium gas and a few percent of a working gas as the discharge gas. Planar, dielectric-covered electrodes are excited with a sinusoidal signal of 50 Hz or greater. The system's use of significant amounts of helium would most likely compromise its cost effectiveness for large-volume, high-speed treatment of films or webs. Many applications for films require single-side treatment. This type of treatment would be difficult to obtain with these embodiments.

The above patent disclosures involve apparatus or processes that rely on the substrate being exposed directly to plasma species generated in the plasma-discharge zone. Polymer surfaces can also be modified by convecting plasma species and metastables out of the production zone and onto the polymer surface. This method is most effectively used at pressures below one Torr due to the rapid collisional recombination of ions that occurs at high gas pressures. The use of a microwave-generated plasma (f=2.45 GHz) to treat polymers films located downstream of the plasma source is discussed in Foerch et al., "Oxidation of polyethylene by remote plasma discharge: a comparison with alternative oxidation methods," *J. Polym. Sci. A.* 28, pp. 193–204 (1990), and Foerch et al., "A comparative study of the effects of remote nitrogen plasma, remote oxygen plasma, and corona discharge treatments on the surface properties of polyethylene," *J. Adhesion Sci. Technology* 5, pp.549–564 (1991). Surface levels of oxygen up to 30% and surface levels of nitrogen up to 40% were reported. The system employed operated at low pressure (P~1 Torr) and would be difficult to scale for wide films.

U.S. Pat. No. 4,937,094 by Doehler et al. discusses the use of a microwave- or RF-generated plasma to generate a high flux of metastable species which in turn are used to transfer energy to a remotely introduced precursor or etchant gas. Metastable species are generated by using a gas jet to convect active plasma species out of the microwave- or RF-discharge zone for a sufficiently long path that the ion species recombine to form metastables. Long-lived metastables are convected by the pressure differential, and are either used to collide with a remotely introduced gas with low-level ionization resulting or applied directly to a substrate material. The embodiment is directed primarily to amorphous-silicon deposition and etching techniques for semiconductor applications, and small-area treatments.

Atmospheric-pressure remote-plasma treatments have been reported by Frierich et al., "The improvement of adhesion of polyurethane-polypropylene composites by short time exposure of polypropylene to low and atmospheric pressure plasma," *J. Adhesion Sci. Technology* 9, pp. 575–598 (1995), using three different discharge methods: spark-jet plasma, arc-jet plasma, and corona-jet plasma. These discharges used low-frequency a.c., high-current d.c., and high-voltage a.c., respectively, to generate plasma discharges. Good lap-shear strength was obtained on laminated polypropylene-polyurethane samples with exposure times as short as 0.1 seconds. Due to gas-flow considerations and the electrode designs used, use of specialty gases and uniformity of treatment become concerns.

U.S. Pat. No. 5,458,856 by Maurepas et al. discloses a coaxial discharge used for the production of ozone, supplying a $CO_2$ laser or the production of atmospheres for the nitriding of metals. The electrodes are excited using a low-frequency sinusoidal signal in the frequency range 20 kHz to 60 kHz. Ozone or excited metastables are convected radial out of the tubular gas passage formed by the coaxial geometry. The system is similar to the coaxial geometry of ozone generators used for water purification in Europe except with radial and azimuthal gas flow employed. The sharp edges and discontinuities of the design are not amicable to the generation of high-power, uniform-plasma discharges. No mention is made of treating web or film materials using the active-plasma species and metastables convected by means of sufficient gas flow.

The present invention provides improvements over the teachings of the prior art. Further aspects and advantages of this invention will become apparent from the detailed description which follows.

SUMMARY OF THE INVENTION

The present invention is directed to continuous-feed plasma treater systems designed to treat continuous substrates, such as webs or films, by continuously feeding the substrates through an enclosure having a plasma discharge that alters the substrate's surface properties in some desirable fashion. According to the present invention, the enclosure has one or more electrode assemblies that generate plasma discharges at working-gas pressures ranging from moderate pressures (e.g., rough vacuums as low as about 10 Torr) to high pressures (e.g., about one Atmosphere). The electrode assemblies are driven by power supplies that excite the electrode assemblies in either an RF resonant excitation mode or a pulsed voltage excitation mode.

By operating in the moderate pressure range of rough vacuum, plasma treater systems of the present invention can be used (a) to treat substrates in an efficient cost-effective manner and (b) to produce treated substrates having superior surface properties as compared to those generated using prior-art systems, such as low-pressure (i.e., <1 Torr) corona-type discharge systems.

BRIEF DESCRIPTION OF THE DRAWINGS

Other aspects, features, and advantages of the present invention will become more fully apparent from the following detailed description, the appended claims, and the accompanying drawings in which:

Figure 1:
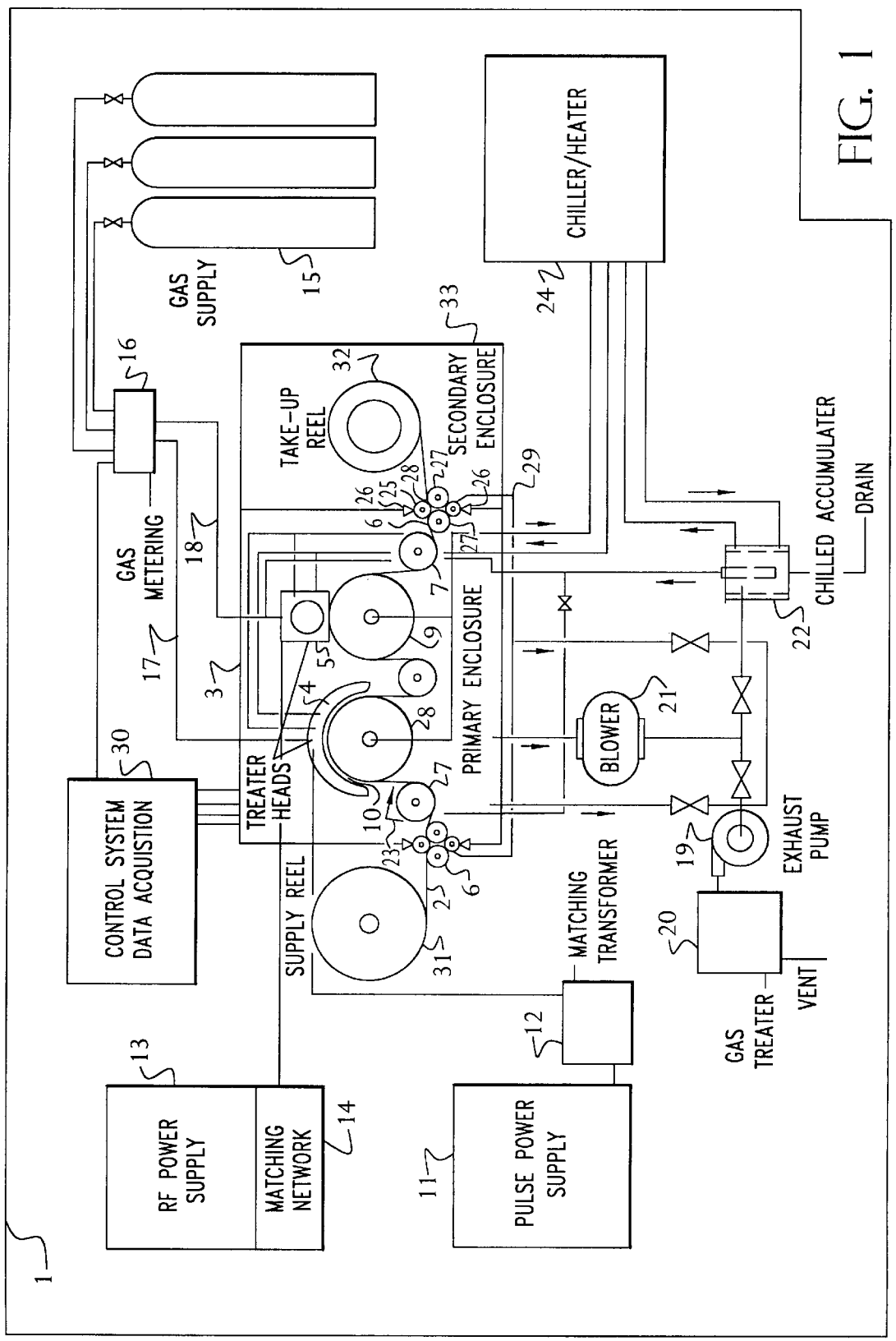
FIG. 1 is a schematic drawing of a plasma treater system, according to one embodiment of the present invention, for the continuous treatment of flexible web or film substrates.

Table 1 lists the results of a study directed to cleaning surface additives from polymer films;

Table 2 lists plasma treatment conditions used to treat two polymer films to remove surface additives which inhibit ink adhesion;

Table 3 lists the treatment conditions for a lamination study;

Table 4 lists plasma treatment conditions used to treat polyethylene films coated with various levels of ethylene vinyl acetate and peel-strength data for the laminated plasma-treated film;

Table 5 lists treatment conditions and contact angles for the treatment of polyethylene using $He+CF_4$ and $He+C_2F_6$ mixtures;

Table 6 lists plasma treatment conditions used to treat linear low-density polyethylene with a low-power direct-exposure plasma using the cylinder-sleeve electrodes followed by indirect plasma exposure using the cylindrical cavity electrode assembly;

Table 7 lists plasma treatment conditions used on polyethylene film using a silicon tetrachloride mixture;

Table 8 lists plasma treatment conditions used on polyethylene films using a dichlorosilane gas mixture;

Tables 9 and 10 list performance data for a 20 $gr/m^2$ polypropylene, spunbond treated using the RF resonant discharge at a reduced pressure of ~55 Torr; and Table 11 summarizes the operating parameters of the discharge techniques of the present invention as compared to conventional corona-discharge technology.

DETAILED DESCRIPTION

The present invention concerns electrode designs, excitation methods, and process conditions used for generating uniform, nonequilibrium, high-power-density plasma discharges suitable for the continuous surface modification of polymer webs and films. The invention also concerns films and webs which have surface properties which have been modified to give them characteristics different from what they possessed prior to treatment.

Two electrode geometries using either of two excitation methods are disclosed. The first electrode employs direct plasma exposure whereby a film or web-like material is translated through the discharge zone and exposed to plasma species. The second electrode structure provides "remote" plasma treatment. A film or web-like material is external to the plasma discharge zone and exposed "indirectly" to plasma-generated species by using gas flow or electric fields to convect plasma species onto the substrate's surface. Both electrode designs can be electrically excited using either an asymmetric voltage pulse or configured as part of a resonant circuit and excited using a sinusoidal RF signal. Pulsed-voltage excitation may require one or both electrode surfaces to be covered by a suitable dielectric covering. At reduced pressure operation of $P \leq 60$ Torr, however, the pulsed-voltage excitation can typically be used without dielectric coverings. The resonant RF excitation may be used with electrodes configured with or without a dielectric barrier depending on the operating conditions desired.

A small-volume, high-power-density, plasma discharge may be generated using a wide variety of gases or gas mixtures. Treatment is generally performed at pressures ranging from at or near atmospheric pressure to the modest rough vacuum of about 10 Torr. The electrode designs and excitation methods disclosed produce improved plasma power densities over existing corona treaters, and scale well for the treatment of wide ($\geq 1$ meter) but thin ($\leq 5$ millimeter) substrates.

A wide variety of substrates may be treated in accordance with the invention. The substrates may be fibers, sheets, films or webs (woven or non-woven), permeable (or porous) to fluids (gases, liquids) or non-porous. The substrates can be natural or synthetic materials, like polymers. Natural materials include, for illustration, cotton, wool, leather, paper, etc., which may be treated as such or as components of laminates, composites, or other materials. A great variety of organic synthetic polymers can be treated such as acetals (polyoxymethylenes), polyamides, polyacrylates, polyolefins (like polyethylene (high and low-density; branched polyethylene), polypropylene, polybutylene, etc.), polycarbonates, polyesters (like polyterephthalates, polybutylene terephthalates (PBT), polyethylenetherephthalete (PET), polyetherimide, polycarbonates, polyphenylene sulfide; ethylene-ethyl acrylate; ethylene acid copolymer; ethylene-vinyl acetate, ethylene-methylacrylate; ethylene vinyl alcohol; polyimides; polymethyl pentene; polyphenylene oxide, polyphenylene sulfide; styrenic resins (ABS); acrylic-styrene acrylonitrile; polystyrene; polyvinylchloride vinylidine chloride, etc.

Film-forming polymers and polymers which lend themselves to form fibers (filaments) and webs are especially desirable for certain applications. The polymers may be homopolymers or copolymers. The polymers may be thermoplastics or thermosets. Suitable polymers may be selected from Modern Plastics, Encyclopedia, P.O. Box 602, Hightstown, N.J. 08520.

Numerous polymers are being used for an increasing variety of applications such as food packaging, electrical insulation, advanced composites, etc. Polymers are selected for a given application on the basis of their physical, electrical, and chemical properties, thermal stability, coefficient of thermal expansion, chemical resistance, and others properties.

The invention can be used to modify or improve the surface properties of the substrate, for instance, wettability (hydrophilicity), hydrophobicity, reduce the static properties of the surface of the substrate, to improve adhesion of other or same materials to the surface of the substrate, and change other properties. For plasma modification of polymer surfaces, see *IBM J. Res. Develop.* Vol. 38, No. 4, July 1994, Plasma Modification of Polymer Surfaces for Adhesion Improvement, F. D. Egitto and L. J. Matienzo, which is incorporated herein by reference. Depending on the thickness of the substrate, the invention can also be used to modify or improve the bulk properties of the substrate (e.g., tensile strength).

Applications of the invention which are of particular interest include: the use of a high-power-density RF discharge to remove slip agents from polymer films to promote ink adhesion for printing; polymer films with surfaces activated using a high-pressure plasma discharge that are capable of being pressure laminated without the use of an adhesive coating; the use of high-pressure pulsed plasma discharge to produce film surfaces with higher levels of oxygen and/or nitrogen than can be obtained using conventional corona treatment technology; polymer films with fluorinated surfaces having increased hydrophobic properties; polymer films having low advancing contact angle produced by grafting acrylic acid to the polymer surface; polymer films treated with silane gases having potential anti-fog application; and the treatment of web substrates for improved hydrophilicity.

The substrates to be treated may be spunbond, meltblown, needle punched, hydro-entangled, woven, or a combination of these techniques. Polymer surfaces can be effectively treated for a variety of applications. Surfaces can be cleaned of process lubricants or waxes and activated for improved printability or lamination. The surfaces of inert polymers such as polypropylene and polyethylene can be chemically functionalized to alter hydrophilic, hydrophobic, and/or adhesion properties. Polymer surfaces can be activated and simultaneously or subsequently exposed to a monomer for grafting. Barrier coatings such as silicon dioxide can deposited directly during plasma exposure.

A wide variety of gases, volatile vapors, and liquids volatile under the treating conditions may be used as discharge media to yield various surface treatment on both film and web substrates. Some of these include: inert gases like argon and helium, oxygen, air, hydrogen, nitrogen, nitrous oxide, nitric oxide, ammonia, chlorine, sulfur dioxide, carbon dioxide, sulfur hexafluoride, tetrafluoromethane, hexafluoroethane, perfluoropropane, acrylic acid, and substituted silanes like dichlorasilane, silicon tetrachloride, and tetraethylorthosilicate. The substances silicon tetrachloride, tetraethylorthosilicate, and acrylic acid are volatile liquids at ambient pressure and temperature, but readily become vaporous at reduced pressure or with slight warming. The gases and vapors listed above are most often used as mixtures in combinations of two or more to produce a specific type of surface treatment. Examples are presented as preferred embodiments when using the resonant RF excitation method. It is preferable to adjust the gas mixture to match the operating pressure, so that, at reduced pressures as in the range of about 150 Torr or lower, any gas may be used, whereas, at pressures in the range of 150 Torr and higher, it is preferable to increase the proportion of inert or of the lesser active gases.

A treater system consists of one or more electrode assemblies housed within an enclosure maintained at a pressure ranging from at or near atmospheric pressure down to the rough vacuum of about 10 Torr. The enclosure is equipped with nip or roller seals to allow for the continuous movement of a thin web or film through the enclosure, yet minimize the introduction of ambient air into the plasma discharge zone or the escape of a working gas. The enclosure serves as an electrostatic shield and to facilitate the recovery of the working gas. Recovered gases can be dehumidified and reused as a discharge gas, or forced through web materials to purge entrained gases and moisture.

Reduced-pressure operation of the discharge over the pressure range from about 10 Torr to about 1 Atmosphere (e.g., 760±50 Torr) has some specific advantages over operation at strictly atmospheric pressure (P=760 Torr) or traditional low-pressure plasma treatments typically operated below one Torr. A rough vacuum in the range of about 10 Torr to about 200 Torr is easily obtained using single-stage vacuum pumping with either a mechanical pump or steam ejector. Rotary-vane and screw-type mechanical pumps are efficient and economical means for generating this level of rough vacuum. A single set of nip or roller seals can be used for rough-vacuum operations as opposed to the series of multiple seals needed for low-pressure operations. This pressure range, however, still allows the discharge considerable immunity to contamination by leakage gases or gases imported into the treater by the substrate. At rough-vacuum operation, the required supply-gas flow rate is significantly reduced compared to strictly atmospheric operation allowing for the economical use of more expensive specialty gases. The use of toxic or combustible gases can also be more efficiently managed at rough vacuum operation. Low-pressure plasma treatments operating at pressures of $P \leq 1$ Torr, have many of these same advantages, but require considerable vacuum pumping for use as a continuous-feed treatment system. Most low-pressure systems utilize diffuse "glow" discharges with power densities of less than a watt per cubic centimeter. The present embodiments when using the RF-resonant excitation are capable of power densities in excess of fifty watts per cubic centimeter. This allows for a smaller discharge zone, and hence a smaller treater.

The first electrode design consists of a cylindrical electrode positioned next to an outer sleeve electrode to form a narrow annular gap in which a nonequilibrium plasma discharge is excited. The sleeve electrode is machined with gas flow ports for the radial flow of a supply gas into the discharge zone and internal fluid passages for the temperature regulation of the electrode and supply gas. The edge contours of the sleeve electrode are machined to provide a smooth transition from the uniform, high-strength electric field of the discharge zone within the annular gap, to a weak electric field beyond the discharge zone. A sheet-like web or film is continuously translated through the plasma discharge zone and exposed directly to the plasma species by being positioned against the outer surface of the cylinder electrode which is rotated and temperature-regulated. Depending on the excitation method and desired operating conditions, one or both electrode surfaces may be covered with a dielectric material. A preferred embodiment illustrated in the present disclosure consists of using a dielectric barrier on the outer surface of the cylinder electrode.

The second electrode design is an extension of the gridded-electrode assembly detailed in PCT application US96/20919 to cylindrical geometry. The design consists of a cylindrical electrode coaxially positioned within the bore of a cavity electrode with the cavity electrode having a slot machined in the side wall of the cavity. The cylinder electrode may be positioned off axis of the cavity electrode's bore toward or away from the wall slot. A plasma discharge is generated in the annular region between the wall of the cavity electrode and the outer circumference of the cylindrical electrode. Long-lived plasma species are convected through the wall slot by means of a gas flow introduced into the cavity electrode. External to the cavity electrode is positioned a temperature-controlled treater drum parallel to and in the vicinity of the cavity wall slot. A web or film positioned on the outer diameter of the treater drum is translated past the wall slot and exposed to the plasma species. The treater drum can be electrically biased using either a dc bias, an asymmetric voltage pulse, or a low-voltage RF signal to facilitate improved exposure of the substrate. In an alternative embodiment of the second electrode design, the cavity electrode is designed in two pieces to simplify fabrication and to allow the use of distributed shunt inductors.

The asymmetric pulsed-voltage excitation for use with the above electrode designs is described in PCT application US96/20919. A positive or negative voltage pulse having a rise time τ, with τ≦1 μsec typically, amplitude 500 volts or greater, and pulse repetition rate 1 kHz to 100 kHz is applied to one of the discharge electrodes with the other electrode grounded. This type of voltage signal has the advantage of producing higher power-density discharges than a uniform sinusoidal signal having a frequency comparable to the pulsed signal's repetition rate. At atmospheric pressure, this excitation method can be used to produce a low-duty-cycle, uniform discharge with essentially any gas or gas mixture. At high-pressure operation (P≧300 Torr), turbulent gas flow within the discharge zone generated by a sufficient supply-gas flow rate, tends to delay the onset of filamentary discharges. Reduced-pressure operation using this excitation method allows higher pulse-repetition rates to be used without the formation of filamentary or streamer discharges. The asymmetric voltage waveform also allows the substrate to be preferentially exposed to charged plasma species of one charge or the other depending on the voltage bias and electrode configuration used.

The resonant RF-voltage excitation is also described in PCT application US96/20919. This excitation method uses a variable inductor in shunt with the discharge electrodes to form a resonant LC circuit. The resonant radian frequency $\omega_r$ for the parallel LC network is given by: $\omega_r=(L_s C_o)^{-\frac{1}{2}}$, where $L_s$ is the inductance of the shunt inductor and $C_o$ is the effective gap and sheath capacitance of the electrodes and plasma discharge. The variable shunt inductor typically takes the form of a wound coil which can be compressed or elongated to increase or decrease the coil's inductance. At moderate to high pressure (about 10 Torr≦P≦about 1 Atmosphere), the impedance of the electrode gap and plasma dielectric is predominately capacitive and resistive over the frequency range 1 MHz to 100 MHz. When coupled to the external shunt inductor or a distributed shunt inductance, and this inductance is tuned for resonance at the frequency of a supply generator, the resulting circuit has predominately a real impedance. This impedance can be effectively matched to that of the RF generator using a suitable matching network. A balanced pi-matching network is preferred in that it applies equal voltages to the electrodes and provides some immunity from stray capacitance effects. The real impedance is desirable both for efficiency in power transfer and the generation of high voltages necessary for gas breakdown. The formation of a resonant discharge increases the discharge's stability to minor changes in boundary conditions due to a translating web or film. When properly excited between narrow discharge gaps, a stable high-current anomalous-alpha discharge or a gamma discharge is generated. (See Y. P. Razier et al., *Radio-Frequency Capacitive Discharges*, CRC Press (1995), or Y. P. Razier, *Gas Discharge Physics*, Springer-Verlag Berlin Heidelberg (1991).) The normal current density on the electrode face is typically greater than 0.01 amp/cm². The discharge tends to fill the electrode gap uniformly with an ignited plasma having a 100% duty cycle. Power densities ten times or greater than those obtained using the asymmetric pulsed voltage can be obtained. For stable operation at atmospheric pressure, this type of excitation typically requires the use of an inert or Nobel gas, such as helium or argon, and a few to several percent of a working gas, such as oxygen or carbon dioxide. By reducing the discharge pressure to nominally P≦150 Torr, essentially any gas or gas mixture can be used, and a stable, uniform high-power-density plasma discharge produced. The upper frequency of operation can be extended from 30 MHz to 82 MHz. Since the power density for this type of discharge scales as $\omega^{2/3}$, and the electron number density as $\omega^{4/3}$, where ω is the radian frequency of the exciting voltage, using higher frequencies has specific advantages. Difficulties arise however with the physical scaling of the discharge at higher frequencies due to wavelength effects. The use of distributed inductances and proper feed techniques are then required to produce a uniform discharge along the electrodes length.

I. High-Pressure Plasma Treater System

FIG. 1 is a schematic drawing of a plasma treater system 1, according to one embodiment of the present invention, for the continuous treatment of flexible web or film substrates. The flexible substrate 2 is fed into an enclosure 3 which houses one or more treater heads. FIG. 1 illustrates two different types of treater heads 4 and 5, housed within enclosure 3. Roller-seal assemblies 6 are used to provide feed-through mechanisms for substrate 2 to enter and exit enclosure 3, while minimizing the introduction of ambient air into enclosure 3 or the escape of process gases from within enclosure 3. Substrate 2 is guided past treater heads 4 and 5 by means of guide rollers 7 and by having substrate 2 positioned against cylindrical electrodes 8 and 9. In the present illustration, treater head 4 and cylinder electrode 8 comprise the "cylinder-sleeve electrode assembly" and treater head 5 and cylinder electrode 9 comprise the "cylindrical cavity electrode assembly." These assemblies are disclosed in detail in subsequent embodiments. Plasma exposure of substrate 2 occurs at treater head 4 when a working gas in gap 10 electrically breaks down with the application of a strong electric field caused by an applied voltage difference between treater head 4 and cylinder electrode 8. This voltage difference can be generated by using either the asymmetric voltage pulse from pulse power supply 11 and matching transformer 12, or the sinusoidal RF voltage generated by RF power supply 13 and matching network 14. In a similar manner, a second plasma exposure may be performed at treater head 5 with the plasma excited by either the asymmetric pulsed voltage from supply 11 or the RF voltage from supply 13.

Supply gases 15 are pressure regulated, metered, and mixed (16) and then supplied to treater heads 4 and 5 through lines 17 and 18, respectively, to become the plasma medium. The pressure P within enclosure 3 is regulated anywhere from at or near atmospheric pressure down to a rough vacuum of about 10 Torr by means of gas metering 16 and exhaust or vacuum pump 19. If necessary, exhaust gases from vacuum pump 19 can be treated by means of suitable gas treater 20. The working gas within enclosure 3 can be partially recovered by means of blower 21, dehumidified in accumulator 22, and recirculated to treater head 4 and/or 5 for reuse as a plasma medium. Recovered working gas can also be used to purge (23) entrained and adsorbed gases from web or film substrates 2. The accumulator 22, treater heads 4 and 5, and electrodes 8 and 9 can be temperature regulated by means of the chiller/heater 24.

Different types of roller-seal assemblies 6 can be used as a feed-through device for a thin film or web substrate 2. A single three-roller feed-through assembly consisting of two noncompliant rollers and a single compliant roller can be used to provide the desired pressure differential; however, the assembly in FIG. 1 is detailed as a preferred embodiment. This assembly has four rollers: two noncompliant metal rollers 25 with wiper seals 26 along the length of the rollers 25, and two compliant rollers 27, each rolling against the two noncompliant rollers 25. This configuration produces a cavity 28 between the four rollers which can be evacuated by means of exhaust pump 19 through line 29. By maintaining the pressure in cavity 28 less than the pressure in enclosure 3, the leakage of ambient air into enclosure 3 during reduced-pressure operation can be significantly decreased. Each wiper seal 26 is adjustable and can be made using a chemically resistant material such as a glass-reinforced Teflon. The noncompliant rollers 25 should be hardened and ground to minimize wear of wiper seal 26. This will also reduce desorption from the surfaces of rollers 25, which continually enter and exit the controlled environments of enclosure 3 and cavity 28 and the ambient air.

Overall system control and data acquisition can be computer controlled (30). High-speed operation typically requires tension control and motor drives (not shown) on supply reel 31, take-up reel 32, guide rollers 7, and possibly each roller feed-through assembly 6. These drives should be synchronized for start-up, run, and stop operation. For some applications, any stretching of the substrate during or after plasma exposure can produce deleterious effects. When not used as an in-line treater, the primary enclosure 3 can be fitted with a secondary enclosure 33. This enclosure can be purged with an inert gas, for example, to minimize post-treatment reactions that may occur with ambient air.

Those skilled in the art will understand that, for operations at atmospheric pressure (e.g., with pulsed voltage), an enclosure is not necessarily needed.

II. Cylinder-Sleeve Electrode Assembly

Figures 2A, 2B:
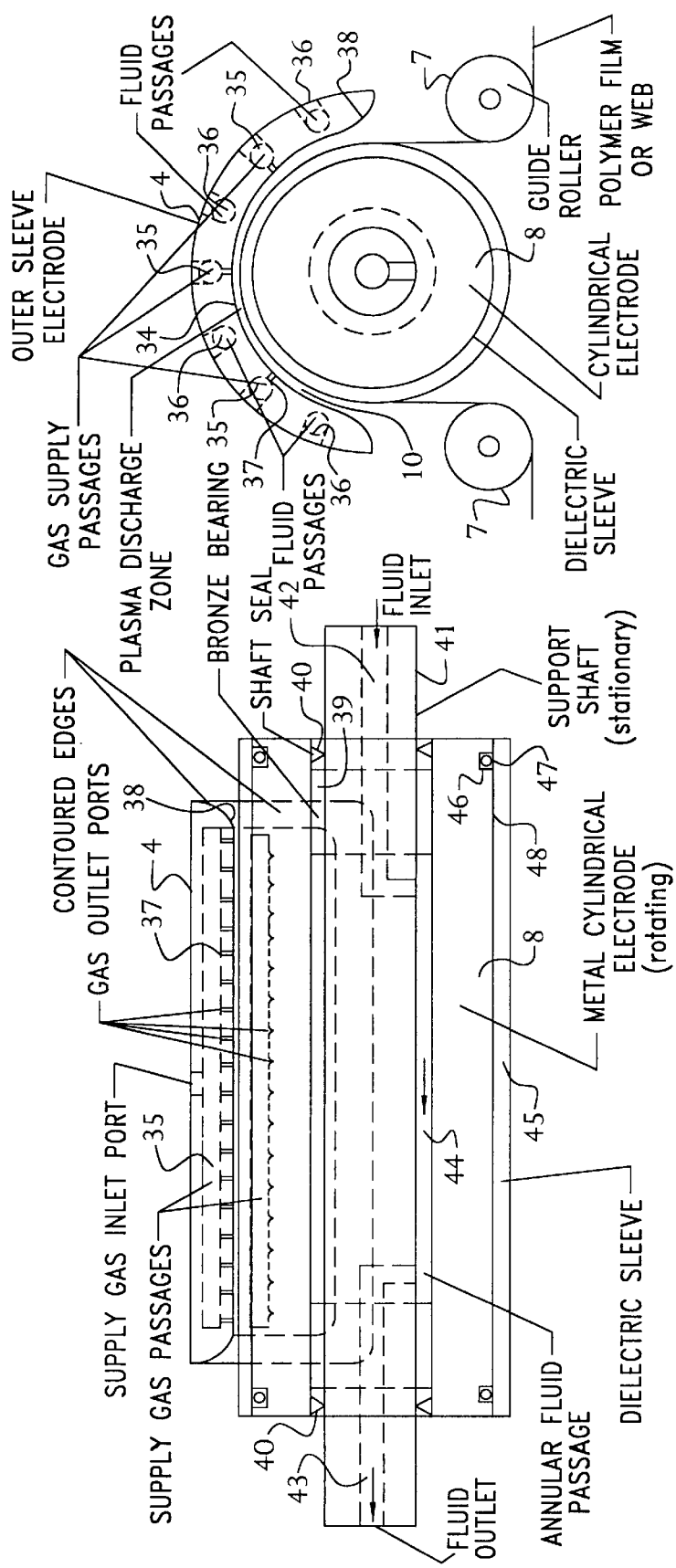
FIG. 2 shows a midplane cross-sectional side view and a midplane cross-sectional end view of a cylinder-sleeve electrode assembly, according to one embodiment of the present invention.

FIG. 2 shows a midplane cross-sectional side view and a midplane cross-sectional end view of a cylinder-sleeve electrode assembly, according to one embodiment of the present invention. The electrode configuration has a cylindrically shaped electrode and metal sleeve electrode with contoured edges and is suitable for use in generating a uniform plasma discharge over the gas pressures range of about 10 Torr≦P≦about 1 Atmosphere. The sleeve electrode 4 is positioned so that its concave face is facing and parallel to the cylindrical electrode 8. Sleeve electrode 4 is positioned typically within a few millimeters of cylinder electrode 8 so that a narrow, uniform annular region 10 formed. The sleeve electrode 4 and cylinder electrode 8 are held in position relative to each other by means of a support structure not shown. This structure electrically isolates the two electrodes 4 and 8 as well as any external structures such as the enclosure. It is preferable that this structure provide a means of adjusting the relative position of electrodes 4 and 8, so that annular gap 10 may be varied by several millimeters.

The metal sleeve electrode 4 machined with an internal radius of curvature (34) slightly greater than the outer radius of cylindrical electrode 8. This difference in radii may be a few millimeters for strictly film treatment or several millimeters for treatment of thicker web materials. Gas flow passages 35 and fluid passages 36 are machined into the body of sleeve electrode 4 parallel to its length. Small holes 37, typically #65 or larger, are drilled radially from the concave face of the sleeve electrode 4 to the gas passages 35. The edge regions 38 of sleeve electrode 4 are machined to approximately an elliptic or hyperbolic contour to provide a smooth transition of the electric field within the narrow annular gap 10 to the outside of sleeve electrode 4. Annular gap 10 is the primary plasma discharge zone, with some plasma extending to the contoured region 38.

The cylinder electrode 8 is machined with the center bored concentric to the outer diameter and fitted with bearings 39 and shaft seals 40 to accommodate a support shaft 41. The support shaft 41 is machined with an inlet passage 42 and outlet passage 43 to accommodate the flow of a temperature regulating fluid. Clearance is machined in the bore of the cylinder electrode 8 so that an annular passage 44 is formed to allow the flow of the temperature-regulated fluid between inlet passage 42 and outlet passage 43. The outer diameter of cylinder electrode 8 may be fitted with a dielectric material 45, either in the form of a dielectric sleeve or dielectric coating. A suitable dielectric coating may also be either flame- or plasma-sprayed onto the outer diameter of the cylinder electrode 8 or the sleeve electrode 4. When a dielectric sleeve is used, the cylinder electrode 8 should be machined with sufficient clearance to accommodate thermal-expansion differences between the metal-cylinder electrode 8 and dielectric sleeve 45. The cylinder electrode 8 can be machined with a set of "O"-ring grooves 46 and fitted with "O" rings 47, and a suitable oil used to fill the clearance gap 48 between the cylinder electrode 8 and dielectric sleeve 45. This will provide thermal contact between outer dielectric sleeve 45 and temperature-regulated cylinder electrode 8, and prevent a plasma discharge from occurring within this clearance gap.

Guide rollers 7 may be employed to guide and position substrate 2 securely against the outer diameter of cylinder electrode 8. Contact between substrate 2 and electrode 8 should be made before annular gap 10 and contour region 38. Web materials in particular are susceptible to thermal damage or burn through which can be minimized with thermal contact to cylinder electrode 8 and sufficient gas flow from outlet holes 37.

The embodiment illustrated in FIG. 2 can be modified for particular applications without significantly departing from the scope of the design. A wide treater will require a larger diameter cylinder electrode 8 than would a narrow treater. Thin-substrate treatments may require cylinder electrode 8 or guide rollers 7 to be driven in order to reduce the tension of substrate 2. If the treatment options allow cylinder electrode 8 to be used without a dielectric sleeve 45, or if a sprayed dielectric coating is employed, an elliptic or hyperbolic contour similar to 38 can be machined onto cylinder electrode 8. This contour should, however, extend into the region of cylinder electrode 8 covered by sleeve electrode 4.

For RF-resonant excitation of short-electrode structures (L≦0.5 meter), electrical connection to sleeve electrode 4 and cylinder electrode 8 is best facilitated by connecting a high-voltage-supply lead separately to each end the electrode pair and the variable shunt inductor to the opposite ends of the electrode pair. For longer electrodes and higher-frequency operation (f≧13.56 MHz), two sleeve electrodes 4 can be positioned azimuthally around a single cylinder electrode 8. A sequence of n variable inductors can be connected between the two sleeve electrodes. Since these inductors are in parallel, the required inductance of each shunt inductor will be n times the required inductance for resonance with the shunt capacitance generated by the two sleeve electrodes. This shunt capacitance will be the series combination of the gap capacitances of the two sleeve electrodes. Each high-voltage connecting lead from the pi-matching network should be branched into two or more leads of equal length, and connected with uniform spacing to each sleeve electrode. The shunt variable inductors can be partially tuned independently to provide a more uniform voltage distribution along the discharge gap.

Electrode excitation using the asymmetric pulsed voltage is simpler than for the resonant RF-voltage excitation since wavelength effects are less important. For pulsed voltage operation, the cylindrical electrode 8 is usually grounded and the sleeve electrode 4 is excited with the voltage pulse. Electrical connection is generally made in the center of the backside of electrode 4, or to a metal support bar mounted on the backside of electrode 4.

Figure 3:
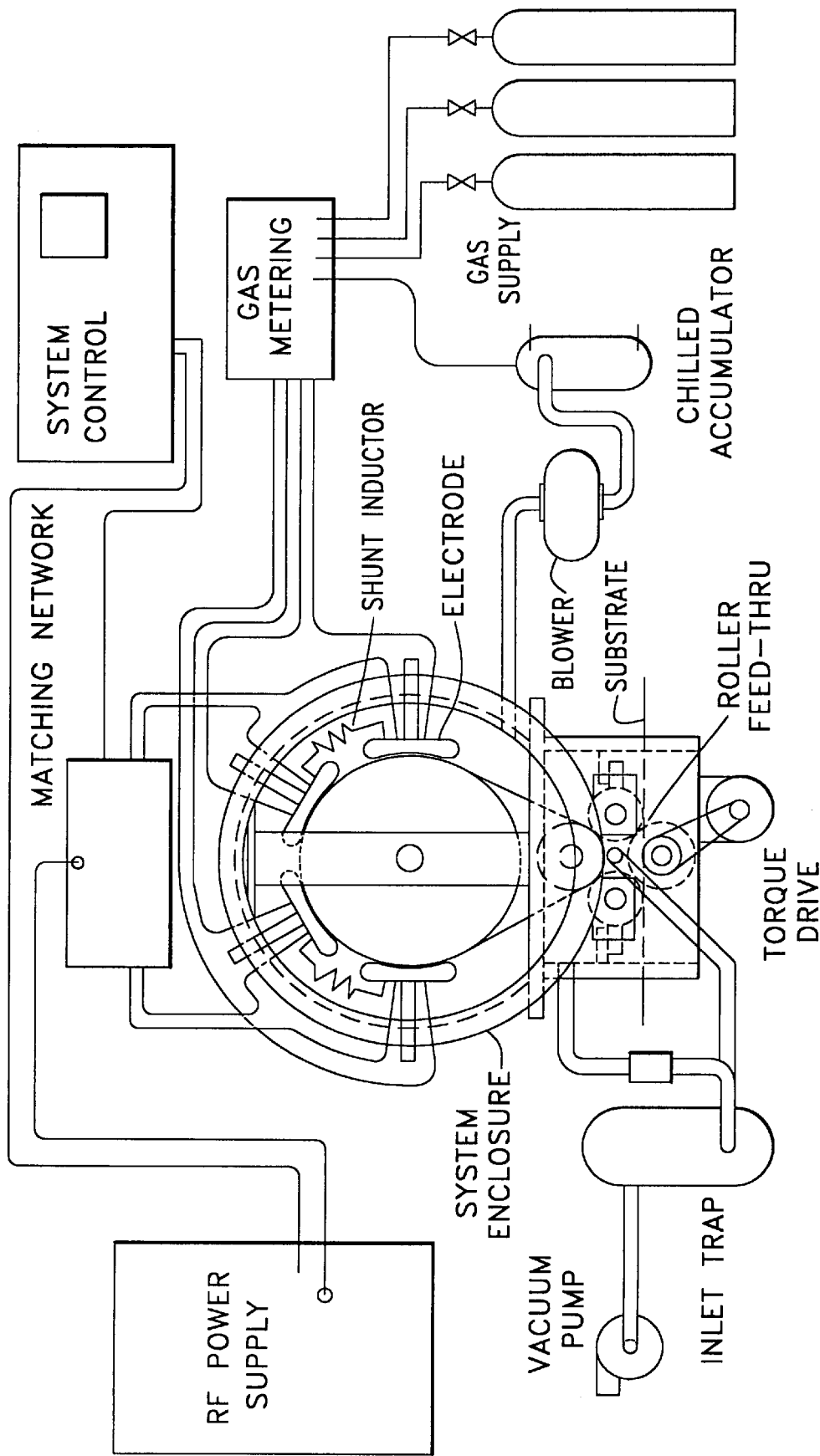
FIG. 3 is a schematic drawing of a plasma treater system, according to an alternative embodiment of the present invention, for the continuous treatment of flexible web or film substrates.
Figure 4:
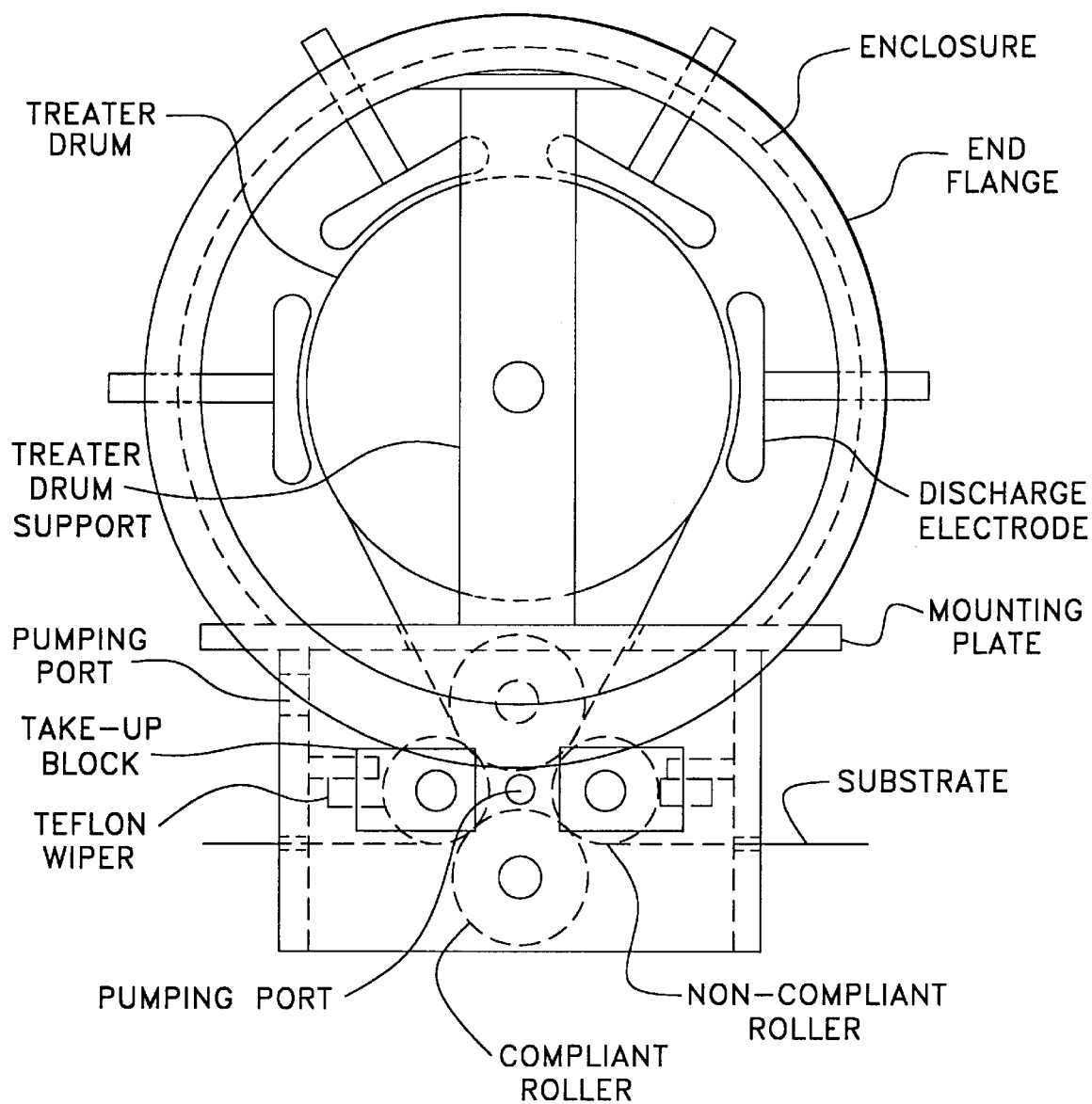
FIG. 4 shows a midplane cross-sectional end view of the cylinder-sleeve electrode assembly of the plasma treater system of FIG. 3.

FIG. 3 is a schematic drawing of a plasma treater system, according to an alternative embodiment of the present invention, for the continuous treatment of flexible web or film substrates. This embodiment is based on a variation of the cylinder-sleeve electrode assembly of FIG. 2, in which the sleeve electrode comprises four electrodes, electrically connected in two pairs by shunt inductors. In this embodiment, the enclosure houses a single cylinder electrode with the two pairs of sleeve electrodes excited in the resonant RF excitation mode. The substrate enters and exits the enclosure through a single roller-seal assembly. FIG. 4 shows a midplane cross-sectional end view of the cylinder-sleeve electrode assembly of the plasma treater system of FIG. 3.

III. Cylindrical Cavity Electrode Assembly

Figures 5A, 5B:
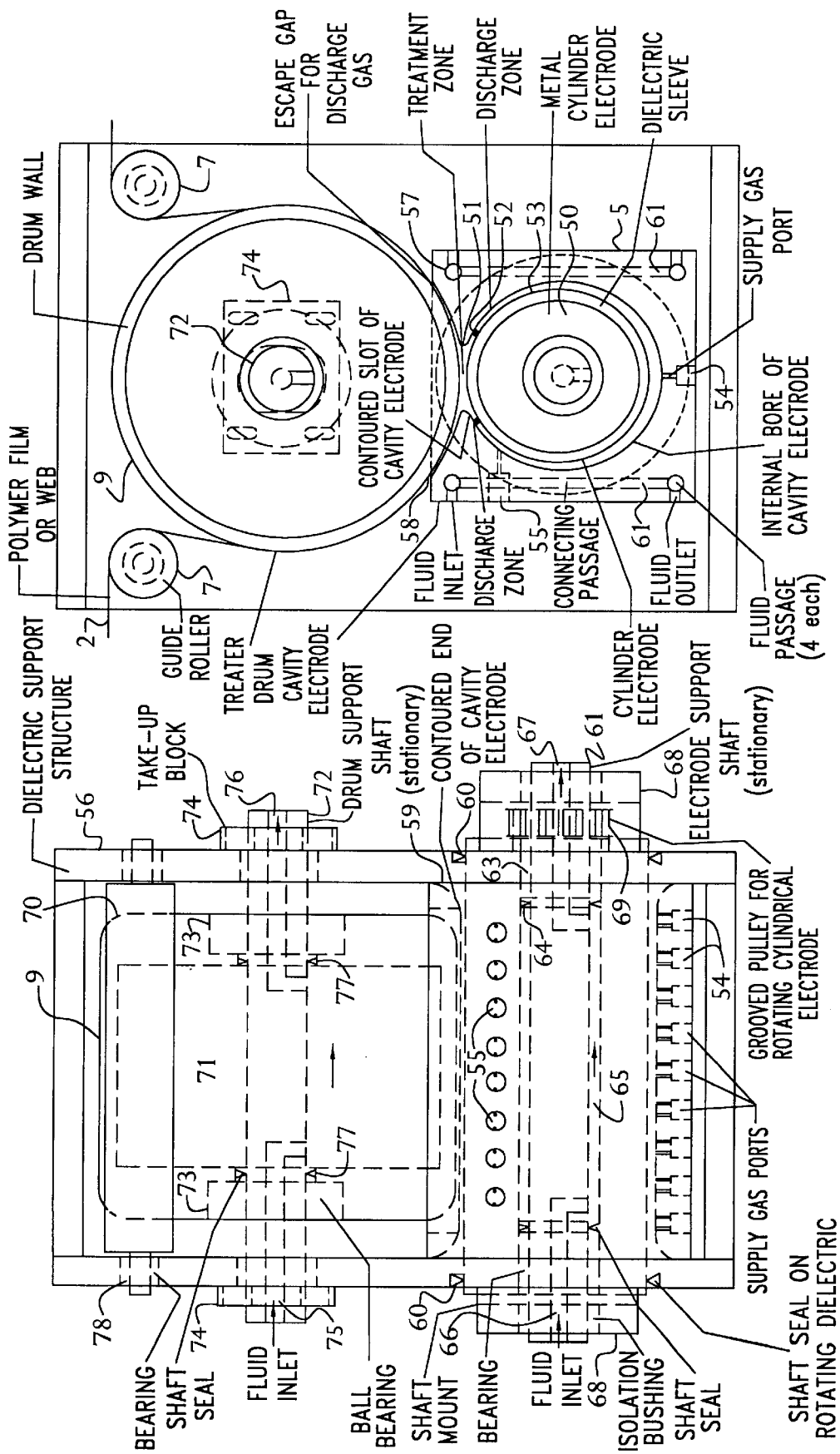
FIG. 5 shows a midplane cross-sectional side view and a midplane cross-sectional end view of a cylindrical cavity electrode assembly, according to one embodiment of the present invention.

FIG. 5 shows a midplane cross-sectional side view and a midplane cross-sectional end view of a cylindrical cavity electrode assembly consisting of three separate electrodes for the production of two distinct regions of plasma for plasma treatment of film or web substrates, according to one embodiment of the present invention. This configuration is an extension and improvement of the grid-electrode geometry presented in PCT application US96/20919. At moderate to high gas pressures (about 10 Torr$\leq$P$\leq$about 1 Atmosphere), strong electric fields are required to initiate a plasma discharge; however, once a discharge is initiated, a weaker electric field can be used to sustain the plasma or bias long-lived plasma species. The following electrode geometry is designed to produce two distinct regions of electric field: a primary region of strong electric field were a plasma discharge is generated and a secondary region of weak or no electric field where a plasma is sustained or long-lived plasma species are convected and used to treat a polymer substrate.

Cavity electrode 5 having a cylindrical bore is fitted with a coaxially positioned cylinder electrode 50. A portion of the cavity electrode's wall is machined away to form a slot 51 running parallel to the cavity electrode's bore. The internal-cylinder electrode 50 may be positioned off axis of the bore of cavity electrode 5 toward or away from wall slot 51. The internal edge 52 of the cavity electrode 4 near wall slot 51 is machined with a smooth contour (e.g., elliptic or hyperbolic in shape) to provide a gradual transition of the electric field established within the annular gap 53 between cavity electrode 5 and cylinder electrode 50. With the application of a suitable high-voltage signal applied between the cavity electrode 5 and the cylinder electrode 50, a working gas within annular gap 53 is made to break down and form a plasma discharge. In FIG. 5, the cylinder electrode 50 is displaced toward wall slot 51, so that the plasma discharge will occur near wall slot 51. Gas flow introduced into the cavity electrode 5 through supply gas ports 54 and 55 will flow out wall slot 51 and convect some of the plasma species beyond wall slot 51. Gases introduced into ports 55 may be like or different gases compared to those introduced through gas ports 54.

Support structure 56 is made so that the cylinder electrode 50 can be positioned toward or away from wall slot 51 depending on the nature of the discharge desired. As an alternative, cylinder electrode 50 may be positioned toward gas ports 54 allowing a discharge to be initiated within the annular gap 53 near gas ports 54. A secondary gas may then be introduced through gas ports 55 to influence the plasma energy level and number of metastable states present.

A third electrode treater drum 9 is positioned external and parallel to cavity electrode 5 with its outer diameter close to the wall slot 51. A film or web substrate 2 is positioned using guide rollers 7 on the outer diameter of treater drum 9. Substrate 2 is translated past wall slot 51 by the rotation of treater drum 9 and exposed to plasma species convected through wall slot 51. Treater drum 9 is positioned outside the cavity electrode 5 in a curved recess 57 machined in the wall of the cavity electrode 5 having wall slot 51. Curved recess 57 is machined with a radius slightly greater than the radius of treater drum 9, so that a small uniform clearance gap 58 exists between treater drum 9 and cavity electrode 5. The working or discharge gas is allowed to escape along gap 58 for continued exposure of substrate 2.

Cavity electrode 5 and cylinder electrode 50 can be excited with either the asymmetric pulse voltage or the resonant RF signal. The treater drum 9 can be electrically biased to a potential different from that of the cavity electrode 5 or cylinder electrode 50 to aid in surface treatment of substrate 2. This bias can be in the form of an asymmetric pulse voltage or an RF signal of a voltage amplitude less than those of electrodes 5 and 50.

The end openings of the bore in cavity electrode 5 are machined with contoured edges 59, so as to provide a smooth transition of the electric-field gradients. The cavity ends are blocked to axial gas flow by the dielectric support structure 56 and shaft seals 60 on the outer diameter of cylinder electrode 50. The cavity electrode 5 is machined with fluid passages 61 for the flow of a temperature-regulated fluid. A cavity electrode constructed of aluminum has been tested and found to operate satisfactorily. A suitable stainless steel or other metal compatible with the gases or vapors used can also be used.

Cylinder electrode 50 is constructed similar to electrode 8 in FIG. 1. Electrode 50 is center bored to accommodate a partially hollowed support shaft 62, bearings 63, and shaft seals 64. The bore diameter is machined sufficiently larger than the support shaft 62 to produce an annular passage 65 between support shaft 62 and cylinder electrode 50. A temperature-regulated fluid is introduced through inlet 66 into passage 65 and exited through outlet 67. The ends of support shaft 62 are held by external shaft mounts 68. For high-power discharges, cylinder electrode 50 can be made to rotate slowly within cavity electrode 5 to distribute the thermal loading. A grooved pulley 69 is fitted to the end of the cylinder electrode 50 to allow an external drive (not shown) to rotate the electrode.

Depending on the desired operating conditions, cylinder electrode 50 can be used with or without a dielectric covering. If electrode 50 is used with a plasma- or flame-sprayed dielectric coating, or without a dielectric coating, cylinder electrode 50 can be machined with contoured ends similar to 59 to produce a smooth transition of the applied electric field.

Treater drum 9 is also machined with contoured edges 70 to minimize strong localized electric fields and a hollow interior 71 so that a temperature-regulated fluid can be circulated through the drum in a fashion similar to that in cylinder electrode 50. A support shaft 72 and bearings 73 support treater drum 9 and allow it to rotate freely with the translating of substrate 2. A set of take-up blocks 74 holding support shaft 72 are used to accurately position treater drum 9 within curved recess 57. Support shaft 72 is machined with fluid inlet passage 75 and outlet passage 76 for the circulation of a temperature-regulated fluid. Shaft seals 77 prevent leakage of the temperature-regulated fluid. Guide rollers 7 can be integrated into the support structure 56 using bearings 78.

Alternative variations of the embodiment illustrated in FIG. 5 can be made without substantially departing from the scope of the invention. For example, treater drum 9 can be used as a cylinder electrode similar to cylindrical electrode 8 in FIG. 1. A sleeve electrode similar to electrode 4 can then be positioned next to the treater drum 9. A substrate can then be pretreated prior to or post-treated following treatment by the remote plasma discharge. For grafting, a desirable configuration is to pretreat a substrate with direct plasma exposure followed by a grafting treatment using remote plasma treatment. A polymer surface is functionalized with radicals or oxygen species using the direct plasma treatment and subsequently exposed to a monomer and monomer fragments produced by a discharge in the cylindrical cavity. Rapid polymer grafting has be accomplished using this technique.

Figure 6:
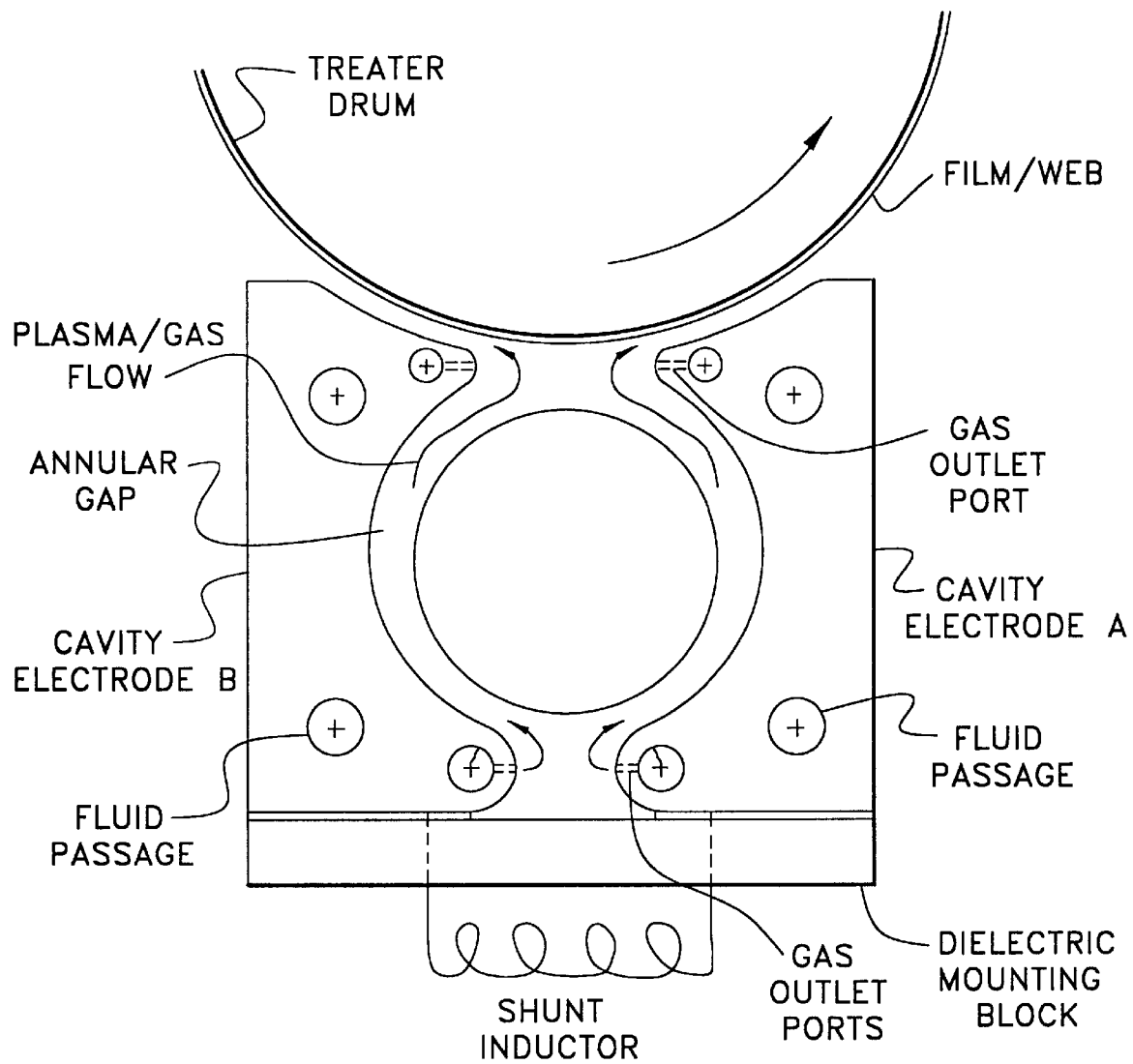
FIG. 6 shows a midplane cross-sectional end view of the lower portion of a cylindrical cavity electrode assembly, according to an alternative embodiment of the present invention.

FIG. 6 shows a midplane cross-sectional end view of the lower portion of a cylindrical cavity electrode assembly, according to an alternative embodiment of the present invention. According to this embodiment, the cavity electrode comprises two pieces electrically connected by a shunt inductor, to simplify fabrication and to allow the use of distributed shunt inductors.

IV. Resonant RF Excitation Method

Figure 7:
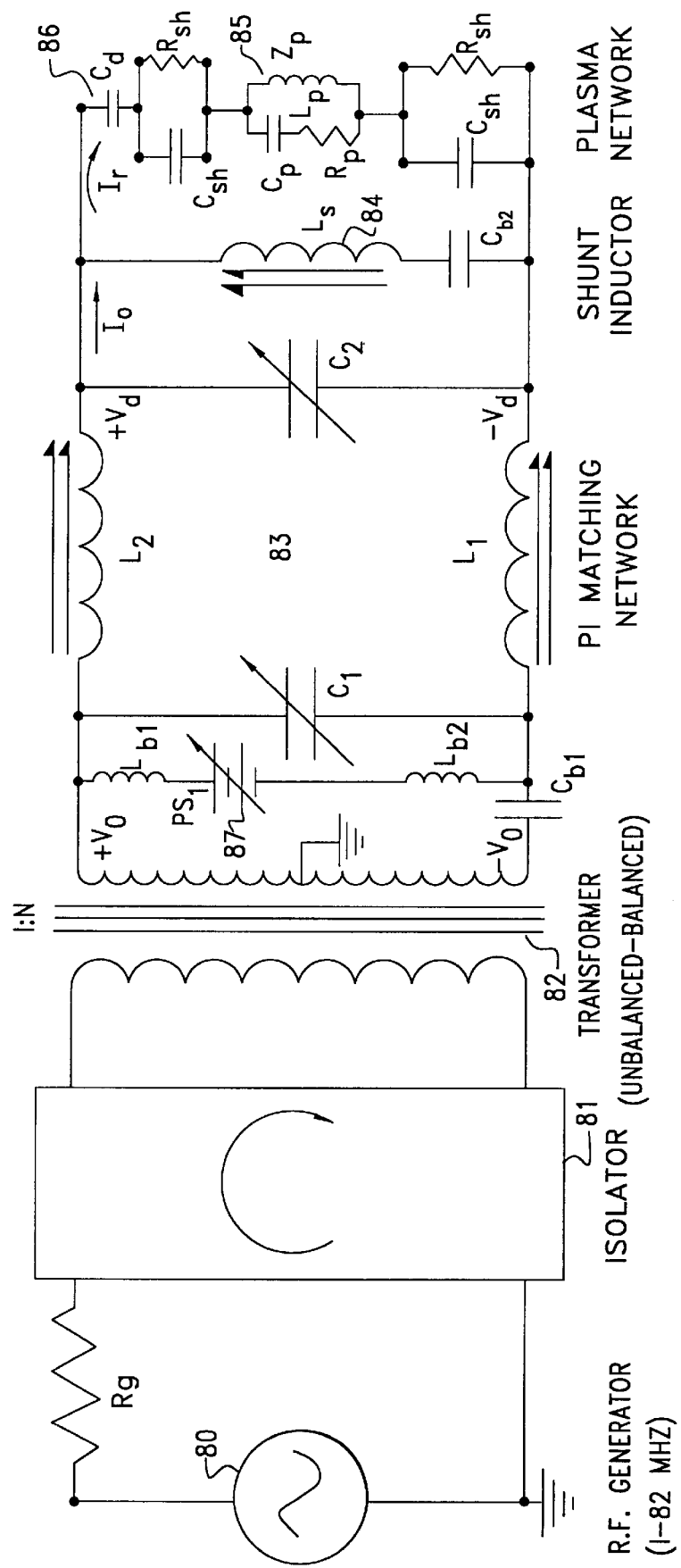
FIGS. 7 and 8 illustrate circuit diagrams that model the components and plasma involved in a resonant RF discharge.
Figure 8:
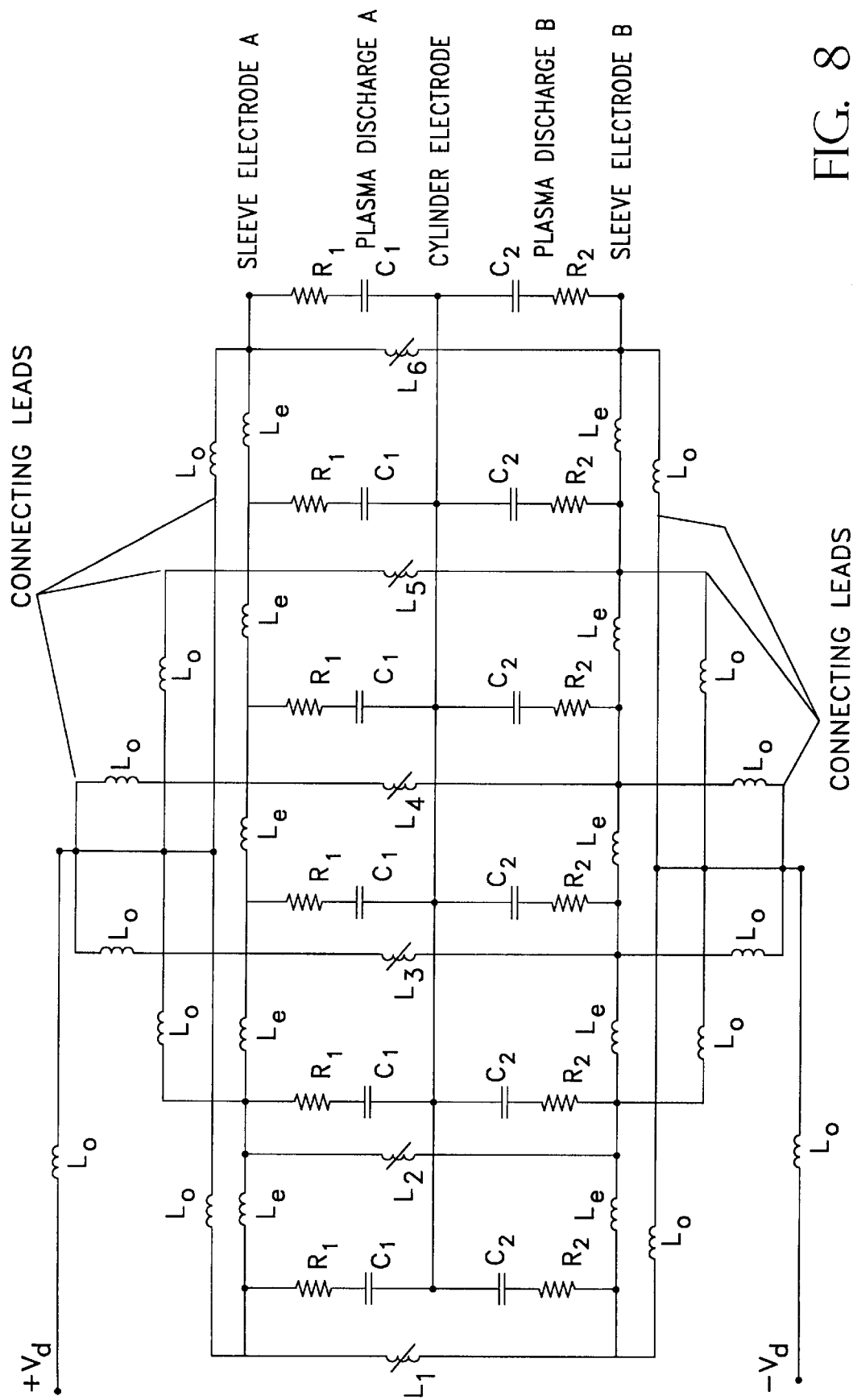

FIGS. 7 and 8 illustrate circuit diagrams that model the components and plasma involved in a resonant RF discharge. FIG. 7 is a circuit diagram for the resonant RF excitation method illustrating the basic circuit components and a generalized impedance model of the plasma, plasma sheath, and dielectric barrier. FIG. 8 is a circuit diagram illustrating distributed inductances of connecting leads and electrodes and a simplified model for distributed capacitance and resistance of the plasma discharge of two sleeve electrodes positioned on the same cylinder electrode.

In FIG. 7, RF generator 80 can take the form of a fixed-frequency source or a variable-frequency source. The frequency range specified of 1 MHz to 82 MHz is to cover the industrial bands: 13.56 MHz, 27.12 MHz, 40.68 MHz, and 81.36 MHz and a low-frequency range of 1 MHz to 13.56 MHz. Isolator 81 is an optional component that minimizes potential damage to RF source 80 caused by excessive reflected power that may occur with load mismatch. RF source 80 typically has an output impedance of 50 ohms, whereas the plasma load may be a few hundred ohms. RF transformer 82 converts the unbalanced output of isolator 81 or source 80 to a balanced output. A balanced output has equal current and opposite voltage potential when properly balanced on the transmission line leads. The balanced output of transformer 82 feeds a balanced pi-matching network 83 comprising variable inductors L1 and L2 and variable capacitors C1 and C2. By tuning the components of network 83, the high impedance of the parallel combination of shunt variable inductor 84 and plasma network 85 can be matched to the RF-source impedance. Inductor 84 is tuned so that the effective capacitance $C_p$ of the plasma network 85 forms a parallel resonant circuit with a radian resonant frequency $\omega_r$ given by $\omega_r = (L_s C_p)^{-\frac{1}{2}}$. This frequency is tuned to the frequency of source 80, or the source frequency is tuned to match $\omega_r$, once a plasma is ignited. When these frequencies are matched, the impedance of the parallel combination of $C_p$ and $L_s$ will be predominately a real impedance for many gas mixtures over the pressure range (about 10 Torr $\leq$ P $\leq$ about 1 Atmosphere). The resonant impedance is effectively matched to the impedance of source 80 using pi-matching network 83. The real impedance also allows a high voltage $2V_d$ to be generated across the plasma load for gas breakdown. Although the balanced network is preferred, an unbalanced network can also be used provided ground paths are such that shunt inductor $L_s$ 84 and plasma network 85 remain a resonant structure.

The Q or quality factor of the resonant circuit as measured by the ratio of the resonant circuit current $I_r$ to the output current $I_o$ of the pi-matching network 83 is typically 3 to 5. The increased current flowing in shunt inductor 84 and plasma network 85 adds stability to the plasma discharge.

The plasma is modeled as having a plasma sheath on each electrode represented by a capacitance $C_{sh}$ in parallel with resistance $R_{sh}$, plasma body $Z_p$, and capacitance $C_d$ (86) for a dielectric barrier. If a dielectric barrier is not used on either electrode face, capacitance $C_d$ is not present and a d.c. or low-frequency ($\omega << \omega_r$,) pulsed bias can be applied to the plasma discharge using power supply 87. Inductors $L_{b1}$ and $L_{b2}$ act as RF blocks for power supply 87, and capacitor $Cb_2$ acts as a d.c. block so that supply 87 is not shorted by shunt inductor 84.

For large electrode structures or high-frequency operation, wavelength effects become important and care must be observed to excite the electrode structure so that a uniform voltage distribution occurs along the electrode length. FIG. 8 illustrates a circuit model for the electrode leads, electrode structure, and plasma discharge for two sleeve electrodes positioned along the same cylinder electrode. The plasma impedance for sleeve electrode A is modeled as six series combinations $R_1$ and $C_1$ and, for sleeve electrode B, as six series combination $R_2$ and $C_2$. Six variable inductors $L_n$ (n=1,2,3,4,5,6) are connected between electrodes A and B, so that the total inductance of the six inductors forms a resonant circuit with the series addition of the effective gap capacitance of electrodes A and B. A network of connecting leads of approximately equal length feeds the shunt inductors paralleled by the distributed resistance and capacitance of the two plasma discharges. Connections $+V_d$ and $-V_d$ are connected to the output leads of a pi-matching network 83. Inductors $L_n$ can be tuned independently to produce a more uniform voltage distribution along the length of electrodes A and B. The specific choice of six parallel combinations is used for illustration. In practice, the number of distributed inductive elements will depend on the length of electrodes A and B and the desired frequency of operation.

Experimental Data and Treatment Conditions

The excitation methods outlined in this specification each generate plasma discharges with characteristics distinct from conventional low-frequency (f $\leq$ 60 kHz) sinusoidal excitation methods. Using an RCA P28A photo multiplier (PM) tube, the optical emission of three different plasma discharges were compared.

Figure 9:
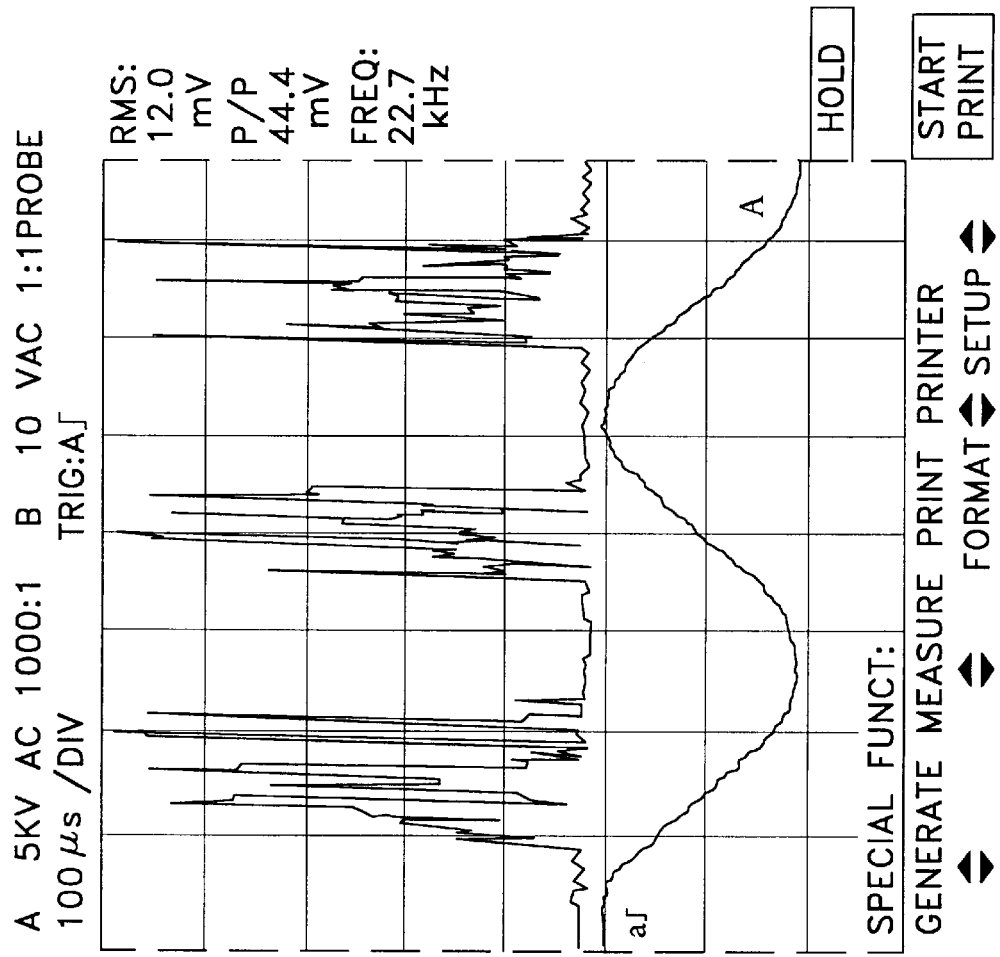
FIG. 9 is an oscillograph trace of an applied low-frequency sinusoidal voltage and the resulting voltage response of a photo multiplier tube imaging the plasma discharge generated by the applied voltage.

FIG. 9 is an oscillograph trace of the voltage waveform for an applied high-voltage low-frequency (f=1 kHz) sinusoidal signal and the PM response due to the resulting plasma discharge. From the PM response, it becomes clear that the plasma discharge turns off and on twice per voltage cycle in a sequence of multiple bursts. This plasma appears as a uniform "glow" to the naked eye, but is not an ignited or self-sustained discharge. The duty cycle of the discharge, as determined by the time a light emitting plasma is present to the period of a voltage cycle, is typically only a few percent.

Figure 10:
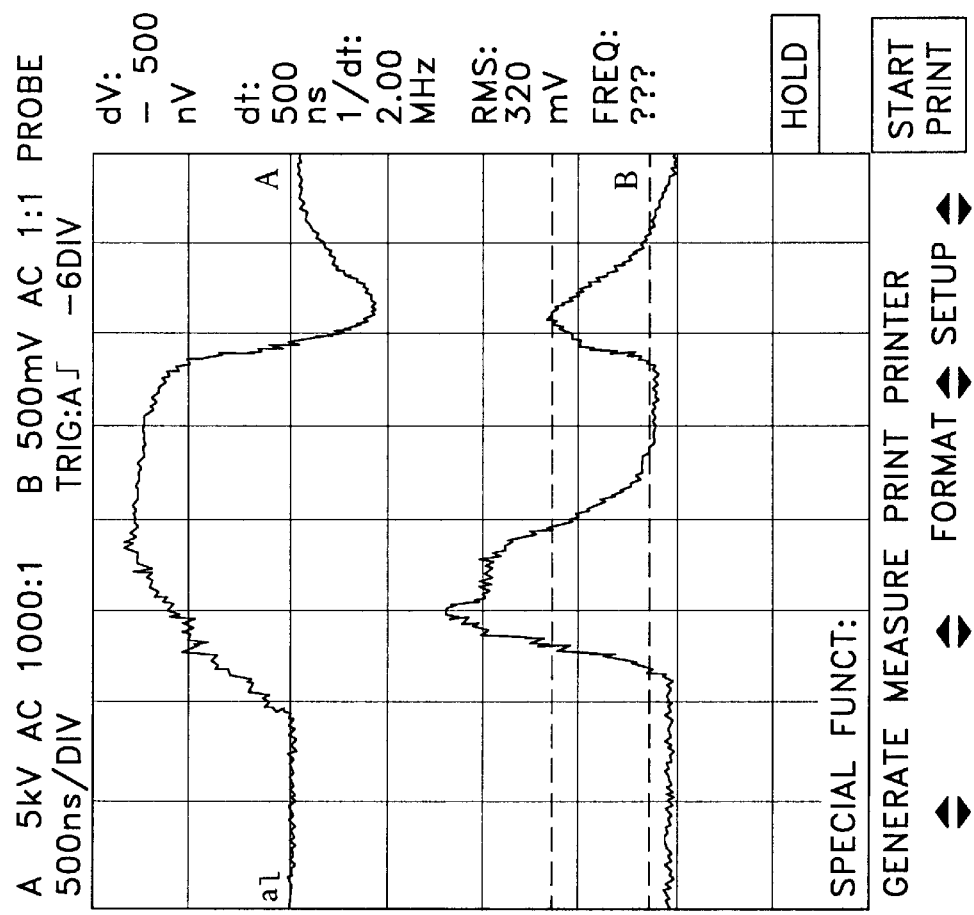
FIG. 10 is an oscillograph trace of an applied asymmetric pulsed voltage and the resulting voltage response of a photo multiplier tube imaging the plasma discharge generated by the applied voltage.

FIG. 10 is an oscillograph trace of an asymmetric voltage pulse and the PM response due to the resulting plasma discharge. Since this discharge is capacitively coupled due to the presence of a dielectric barrier, current will only flow to the discharge with a change in the applied voltage. The voltage pulse (upper trace) has a rise time of approximately 1 microsecond and reaches a peak amplitude of close to 8 kilovolts. From the PM response (lower trace), a plasma is not initiated until the voltage pulse reaches an amplitude of around 4 kilovolts. The discharge ignites as a whole and continues until the voltage pulse peaks. During the plateau of the voltage pulse, the PM response shows the decay time of the plasma discharge (~0.5 microseconds). The fast rise time of this discharge technique allows for higher power densities than those obtained with low-frequency sinusoidal excitation. The discharge duty cycle is typically 10%. The smaller secondary discharge occurs when a negative-voltage pulse occurs following the decay of the primary voltage pulse. This secondary voltage pulse is due to the "kick-back" voltage of the step-up pulse transformer used in the excitation circuit.

Figure 11:
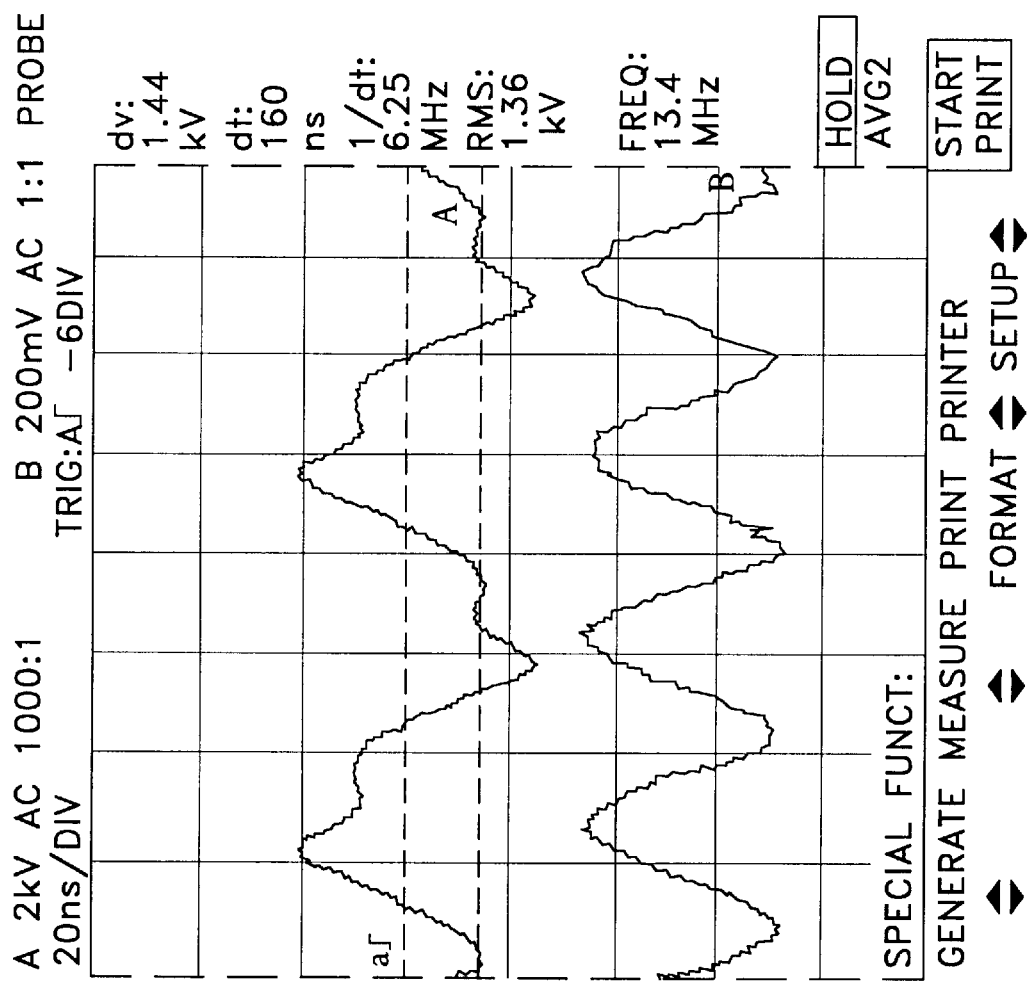
FIG. 11 is an oscillograph trace of an applied high-frequency resonant RF sinusoidal voltage and the resulting voltage response of a photo multiplier tube imaging the plasma discharge generated by the applied voltage.

FIG. 11 is an oscillograph trace of an applied high-frequency 13.56 MHz RF voltage (upper trace) applied to a resonant discharge and the PM response from the discharge (lower trace). The PM response clearly shows the plasma to be continuous since no flat regions exist in the trace. The 2ω response of the PM and second-harmonic content in the applied voltage are due to the nonlinear behavior of the plasma sheaths. Since this form of discharge is continuous, duty cycles up to 100% can be obtained.

Figure 12:
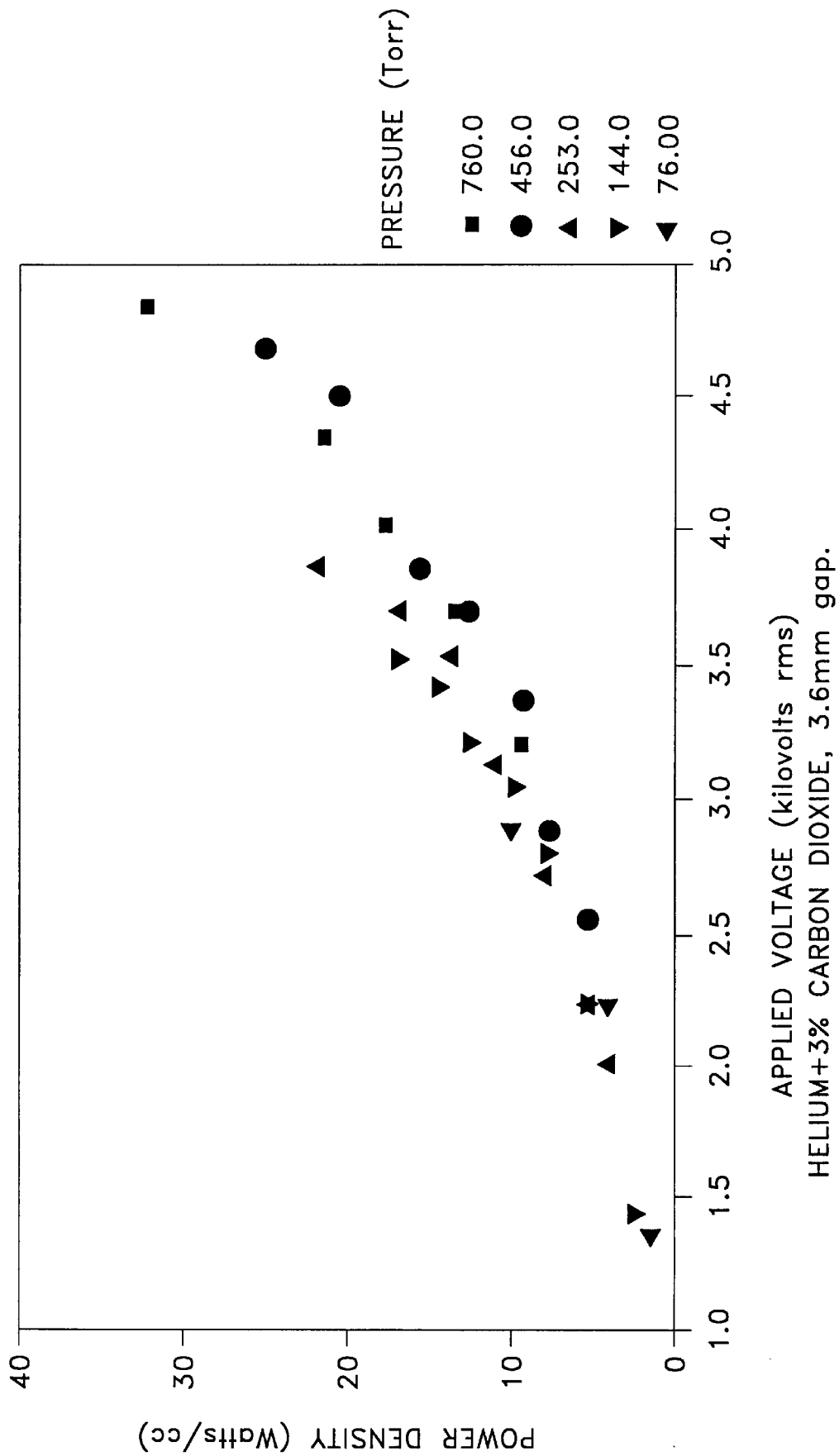
FIG. 12 is a graph illustrating the scaling of discharge power density verses applied electrode voltage for the cylinder-sleeve electrode geometry using the resonant RF excitation.

FIG. 12 illustrates the scaling of power density with applied voltage for the cylinder-sleeve electrode geometry of FIG. 2 when excited as a resonant RF discharge. The power density scales as the applied voltage squared over a broad pressure range ($76 \leq P \leq 760$ Torr), indicating that the discharge mode is the same over this pressure range using the same discharge gas mixture.

The high-pressure plasma apparatuses and methods of the present invention have been found useful in achieving desired properties when used in conjunction with certain plasma chemistries. Some of these desired properties can be categorized as follows: surface cleaning, enhanced wettability, hydrophilicity/lipophilicity, surface grafting, and surface functionalization.

Surface cleaning refers to the removal of extraneous material from the surface of a substrate, such as a film, while leaving the substrate intact. Films and the like have oils, surfactants, lubricants, etc., that have been deposited on the surface during film formation or which bloom to the surface from the film body. These materials should be removed in order to adhere additional materials to the film surface, such as inks during printing of the surface or lamination of additional film or other material.

Enhanced wettability (e.g., receding contact angle) refers to making a substrate hydrophilic to a high degree, where the treated substrate retains its hydrophilic state over an extended period of time. While other methods (e.g., corona treatment) provide hydrophilicity to substances, these methods do not cause the surface to retain this state over time (e.g., polyethylene films that were corona treated will lose hydrophilic properties normally within one day, while the present invention will provide hydrophilicity for several months). This permits the substrate to be used for this property after storage and the like. For example, this property provides films that (a) would have enhanced anti-fog properties in food packaging or (b) anti-static properties in films used to package electronics, etc. In certain instances, prior processes can achieve the extended wettability, but the present invention provides a mode of achieving this property in a commercially feasible manner that is both fast and reliable.

Similarly, hydrophobicity and lipophobicity can be achieved where the present invention is used with certain plasma chemistry. These properties relate to a substrate having surfaces that can act as a chemical barrier to a wide range of materials. It can provide a barrier to hydrocarbons and water and enhance slip, abrasion resistance, etc. (similar to Teflon coatings). Although prior plasma treatments of low pressure may achieve such properties, they were of academic nature or they required extended treatment while the present invention does so in fractions of a second so as to be feasible on a commercial, continuous line process.

When using the electrode configuration of FIG. 5 where the substrate may be outside the electric field, certain chemistries have been found to provide enhanced surface grafting to achieve either hydrophilic or hydrophobic properties without unwanted side reactions occurring on the substrate surface.

The present invention also provides a means of achieving enhanced functionality to the treated surface. For example, where a nitrogen-containing gas and/or oxygen-containing gas is used, one achieves a highly functionalized surface of nitrogen-carbon and/or oxygen-carbon species therein, while only low functionality is achieved by conventional modes of plasma treatment. Treatment at moderate to high pressures enables faster, more uniform, and increased functionalization of a polymer surface relative to low-pressure plasma and corona treatment, as shown in the following table. Higher functionalization usually means better wettability and adhesion for increased performance in printing, lamination, dyeing, etc. Remote low-pressure nitrogen plasma leads to very high functionalization on stationary substrates. A variety of gases can be used. While $N_2O/CO_2$ works well, one may use other systems, such as air, nitrogen, oxygen, argon, $CO_2/O_2$, and the like.

Extent of Surface Functionalization as Measured by Surface [O + N] to C Ratio

| Polymer$^\S$ | Treater$^\dagger$ | Press (torr) | Gas | $J/cm^3$ | $CA_{H2O}$ (deg) | % C | % O | % N | [O + N] C |
|---|---|---|---|---|---|---|---|---|---|
| PE | HP-RF | 76 | $N_2O$, $CO_2$, He | 21 | 52 | 73 | 21 | 4.4 | 0.34 |
| PE | HP-Remote | 89 | $N_2O$, $CO_2$, He | 27 | 64 | 81 | 17 | 2.0 | 0.23 |
| PE | corona | 760 | Air | 20 | 72 | 85 | 15 | 0.6 | 0.18 |
| PE | LPP | 0.3 | $N_2O$, $CO_2$ | 0.03 | 68 | 81 | 14 | 0.8 | 0.18 |

-continued

Extent of Surface Functionalization as Measured by Surface [O + N] to C Ratio

| Polymer[§] | Treater[†] | Press (torr) | Gas | J/cm³ | CA$_{H2O}$ (deg) | % C | % O | % N | [O + N] C |
|---|---|---|---|---|---|---|---|---|---|

[§]PE has [O + N]/C less than 0.01
[†]HP = high pressure (20–800 torr), LPP = low pressure plasma (<1 torr)

Several areas of potential utility in food packaging applications have been identified for plasma-treated polymers. Polymer films plasma treated using high-pressure (800≧P≧50 Torr) discharge technology according to the present invention were investigated for a variety of applications. Applications of particular interest include:

(1) The use of a high-power-density RF discharge to remove slip agents from polymer films to allow ink adhesion for printing;

(2) Polymer films with surfaces activated using a high-pressure plasma discharge that are capable of being pressure laminated without the use of an adhesive coating;

(3) The use of a high-pressure pulsed plasma discharge to produce film surfaces with higher levels of oxygen and nitrogen than can be obtained using conventional corona treatment technology;

(4) Polymer films with fluorinated surfaces having increased hydrophobic properties;

(5) Polymer films having low advancing contact angle produced by grafting acrylic acid to the polymers surface;

(6) Polymer films treated with silane gases having potential anti-fog applications; and (7) Treatment of web substrates.

These different applications are discussed in the following sections.

(1) Plasma Surface Cleaning for Printing Applications

The present invention was used to clean surface additives from polymer films. The results of this study are presented in Table 1. A polymer film with a heavy coating of a slip agent was plasma treated using a dielectric barrier cylinder-aluminum sleeve electrode geometry, based on the cylinder-sleeve electrode assembly of FIG. 2, excited with a resonant RF discharge at 13.56 MHz. The high power density of this discharge method is well suited for surface etching. Plasma discharges using a $CF_4$—$O_2$ mixture at reduced pressure (P~50 Torr), and a He—$CF_4$—$O_2$ discharge at atmospheric pressure were used. These studies quickly revealed that a threshold level of oxygen should be used for sufficient removal of the slip agent. The $O_2$ concentration should be approximately 25% of the $CF_4$ concentration or greater for sufficient print adhesion. Greater oxygen concentrations should be avoided, not only due to the potential for combustion, but also due to the beta chain scission process that occurs on polymers such as polypropylene with increasing surface oxygen content in the presence of UV radiation.

Any metal-faced electrode should not be constructed of a metal such as copper that causes the rapid recombination of atomic fluorine. The aluminum-oxide layer that quickly forms on an aluminum-faced electrode is relatively immune to this process provided chlorine is not present.

A second set of experiments was performed using a $CF_4$—$O_2$ discharge at reduced pressure to remove glycerine- and silicone-based additives from a polyolefin film. Corona treatment is only partially successful at removing silicone-based additives and is especially inadequate with glycerine-based additives. For these tests, a resonant RF discharge at reduced pressure operation with the cylinder-sleeve electrode geometry of FIG. 2 was used. The treatment data and results for tape peel tests are listed in Table 2.

In particular, Table 2 lists plasma-treatment conditions used to remove surface additives from two polyolefin-based films using direct plasma exposure with a resonant RF discharge at 13.56 MHz and a tetrafluoromethane-oxygen plasma. RF plasma treatment was performed using the cylinder-sleeve electrode geometry. A solvent-based ink was applied five to ten minutes after plasma exposure using a nip-roller applicator. The ink was allowed to dry for approximately 30 minutes, and a tape peel test was performed. 3M Scotch brand adhesive tape was firmly pressed onto a printed sample, and then pulled from the sample at 90 degrees to the surface with the level of ink removal observed. The conditions listed yielded essentially 100% ink adhesion with negligible ink removal, whereas untreated samples typically exhibited 80% or better ink removal with a tape peel test. For the plasma dosages used, all treated samples exhibited excellent print adhesion.

Despite the above results, treatment costs may be prohibitive to commercial feasibility without additional improvements. Tetrafluoromethane $CF_4$ is an expensive specialty gas commonly used in semiconductor fabrication for the etching of silicon oxide. The gas used was purchased in a ~220 ft³ cylinder at a cost of ~24¢/liter. The nominal flow rate of 1 liter/minute used for a 15-cm-wide treatment zone and line speed of ~10 m/minutes yields a treatment cost of ~16¢/m² for the $CF_4$ alone. With treatment optimization, this cost could probably be cut in half, and with gas re-circulation cut in half again. This still yields a $CF_4$-gas cost of ~4¢/m². As an alternative, sulfur hexafluoride $SF_6$ should be considered. This gas is approximately ⅕ the cost of $CF_4$ due to its usage as a dielectric insulator for high-voltage applications. At reduced pressure operation P≦100 Torr, $SF_6$ can be used with the resonant RF discharge. Chlorine is another alternative, however the toxic and corrosive aspects of chlorine would need to be addressed.

When using RF direct plasma at 50 to 760 Torr with a $CF_4/O_2$ plasma where the $O_2$ to $CF_4$ ratio is greater than 0.2 (by volume), one achieves sufficient surface cleaning for removal of low molecular weight additives to cause promotion of adequate adhesion of a coating. In comparison, corona discharge in air and low-pressure plasma with $CF_4/O_2$ did not clean the surface adequately enough to promote good adhesion. Further, corona-treated surfaces left a sticky residue due to inadequate ablation (volatilization), while the RF direct plasma operated at 50 to 760 Torr provided good ablation and did not impede the desired, subsequent re-blooming of the low molecular weight additives. In order to obtain certain surface properties (e.g., slip, anti-stick, anti-fog, etc.) on polymer surfaces, low molecular weight additives are blended into the polymer prior to extrusion so that they will bloom to the surface after extrusion. These low molecular weight species make it very difficult to get good adhesion to the surfaces of a film. Efficient surface cleaning at low temperatures (<60 C) prior to coating, laminating, printing, etc. processes operating at process speeds (>50 ft/min) leads to acceptable adhesion without detrimental damage to the underlying polymer surface.

The use of plasmas for surface cleaning is known. $CF_4/O_2$ plasmas are well known for their etching capabilities and are commonly used for cleaning surfaces in the microelectronics industry. These require extended treatment times and are not polymeric substances, which are sensitive to high temperatures.

The present invention provides advantages over the prior art. Only high pressure (>20 Torr) plasma operating in continuous mode with RF power has shown sufficient surface cleaning to promote adequate adhesion of a material to a polymer containing high amounts of additives without damage to the polymer.

$CF_4$ is a source of fluorine radicals and $O_2$ is a source of oxygen radicals that work together synergistically to functionalize and volatilize organic species. Other fluorine radical sources include $SF_6$, $NF_3$ and $F_2$, etc. Oxygen radical sources include $CO_2$, $NO$, $SO_2$. The unique cleaning capabilities of the RF direct plasma at 20–800 torr may be useful in the removal of organics in circuit board manufacture.

(2) Lamination of Plasma-Treated Polyolefins

The present invention was also used to investigate the potential for laminating different polymer surfaces that had undergone plasma exposure. Part of this work stemmed from the concept of treating one surface to produce predominantly acid functionality and treating a second surface for predominantly basic functionality, and then uniting the surfaces under pressure and heat to produce covalent bonding. A second concept was to deposit a fluoropolymer layer that would be conducive to lamination. Lamination between the following polymer pairs was attempted: PET-PE, EVA-PET, and EVA-EVA. The treatment conditions used in this study are listed in Table 3. Lamination was accomplished by initially treating two samples simultaneously and winding the samples on a common reel during plasma treatment with treated surfaces facing. Following plasma treatment, sections from the reel of treated samples were hand fed into a heated set of nip rollers. Several of these samples exhibited cohesive failure dry, but no samples exhibited significant adhesion after a water soaking. The poor results with PET were most likely due to the formation of a weak boundary layer on the PET surface caused by polymer chain scission.

A set of lamination tests was performed on a polyethylene film with varying levels of ethylene vinyl acetate. PE film with EVA levels of 0%, 3%, 9%, and 18% were treated using the cylinder-sleeve electrode geometry of FIG. 2 with a resonant RF discharge at reduced pressure. Treatment conditions and peel strengths are listed in Table 4. Treatment was performed with two film strips treated simultaneously and then wound on a common reel. The distance from the treatment zone to where the two strips merged was ~6 inches. Samples were laminated by using a manual hot press maintained at ~170° F. All samples exhibited good dry adhesion, but only some of the short-exposure samples exhibited adhesion after water soaking.

In particular, Table 4 lists plasma-treatment conditions and peel strengths for polyethylene film that was plasma treated and then heat/pressure laminated. The polyethylene film had varying degrees of ethylene vinyl acetate on the plasma exposed side. Treatment was accomplished using two cylinder-sleeve electrode assemblies with two supply reels of like film. The electrodes were arranged so that just after exiting the treatment zones, the two film strips merged with treatment sides facing. Samples of the resulting single strip were later pressure laminated at approximately 150 degrees centigrade. Laminated samples were subjected to peel tests with the samples dry, or after water soaking.

Figure 13:
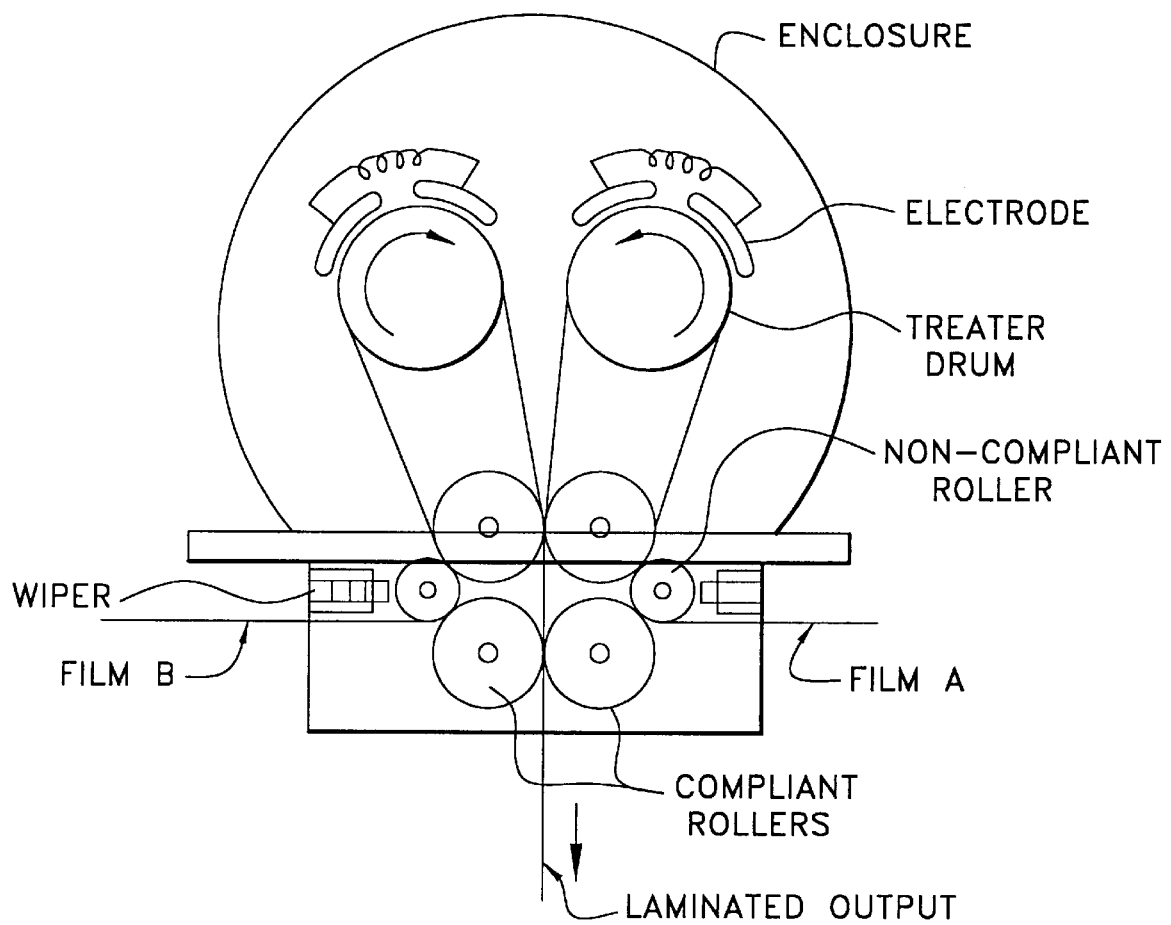
FIG. 13 shows a midplane cross-sectional end view of a twin-drum plasma treater for laminating films, according to one embodiment of the present invention.

FIG. 13 shows a midplane cross-sectional end view of a twin-drum plasma treater for laminating films, according to one embodiment of the present invention. According to this embodiment, the plasma treater has two cylinder-sleeve electrode assemblies similar to that of FIG. 5, except that each sleeve electrode comprises two electrodes electrically connected by a shunt inductor. As shown in FIG. 13, two films (A and B) enter the enclosure through a single rollerseal assembly, are surface treated at different cylinder-sleeve electrode assemblies, and are laminated together with their treated surfaces facing each other by rollers of the roller-seal assembly, with the resulting laminated product exiting the enclosure through the roller-seal assembly.

Lamination capable of withstanding a water soaking is enabled by the formation of covalent bonds or significant van der Waals force bonding. The formation of covalent bonds during the lamination of relatively inert polymers such as polyethylene can be achieved if the plasma treatment process either forms radicals on the polymer surface or deposits an adhesive boundary layer through plasma polymerization or a grafting process. The examples presented in Table 5 used nitrogen plus 1% nitric oxide as the working gas. This form of treatment produces surface radicals that result in covalent bonding. The strong dependence of treatment dosage on the wet pull strength suggests the formation of a low-molecular-weight boundary layer due to chain scission, or the presence of few surface radicals to produce covalent bonding. Polyethylene is fairly robust to UV-induced chain scission with low levels of oxygen present. However, the formation of nitrogen dioxide $NO_2$, due primarily to the reaction of ozone with nitric oxide, is a significant problem. Nitrogen dioxide is a strong scavenger of radicals, as are certain polymer additives. Higher-order oxides of nitrogen are probably equally effective as radical scavengers.

Below are listed several reactions and the corresponding rate constants for the formation of nitrogen dioxide and higher-order oxides:

| | Reaction | k (cm$^3$/sec) |
|---|---|---|
| 1. | $N + O_3 \rightarrow NO + O_2$ | $5.7 \times 10^{-13}$ |
| 2. | $NO + O_3 \rightarrow NO_2 + O_2$ | $1.8 \times 10^{-14}$ |
| 3. | $NO_2 + O_3 \rightarrow NO_3 + O_2$ | $3.2 \times 10^{-17}$ |
| 4. | $NO + NO_3 \rightarrow 2N_2O$ | $2.6 \times 10^{-11}$ |
| 5. | $NO_2 + O \rightarrow NO + O_2$ | $1.7 \times 10^{-11} \exp(-300/T)$ |
| 6. | $NO_2 + NO_3 \rightarrow N_2O_5$ | $3.8 \times 10^{-12}$ |
| 7. | $N_2O_5 + O \rightarrow 2NO_2 + O_2$ | $1 \times 10^{-13}$ |

Reactions 2 and 3 are significant because ozone tends to be long lived and with 1% nitric oxide present, a significant amount of nitrogen dioxide will be formed despite Reaction 1.

Figure 14:
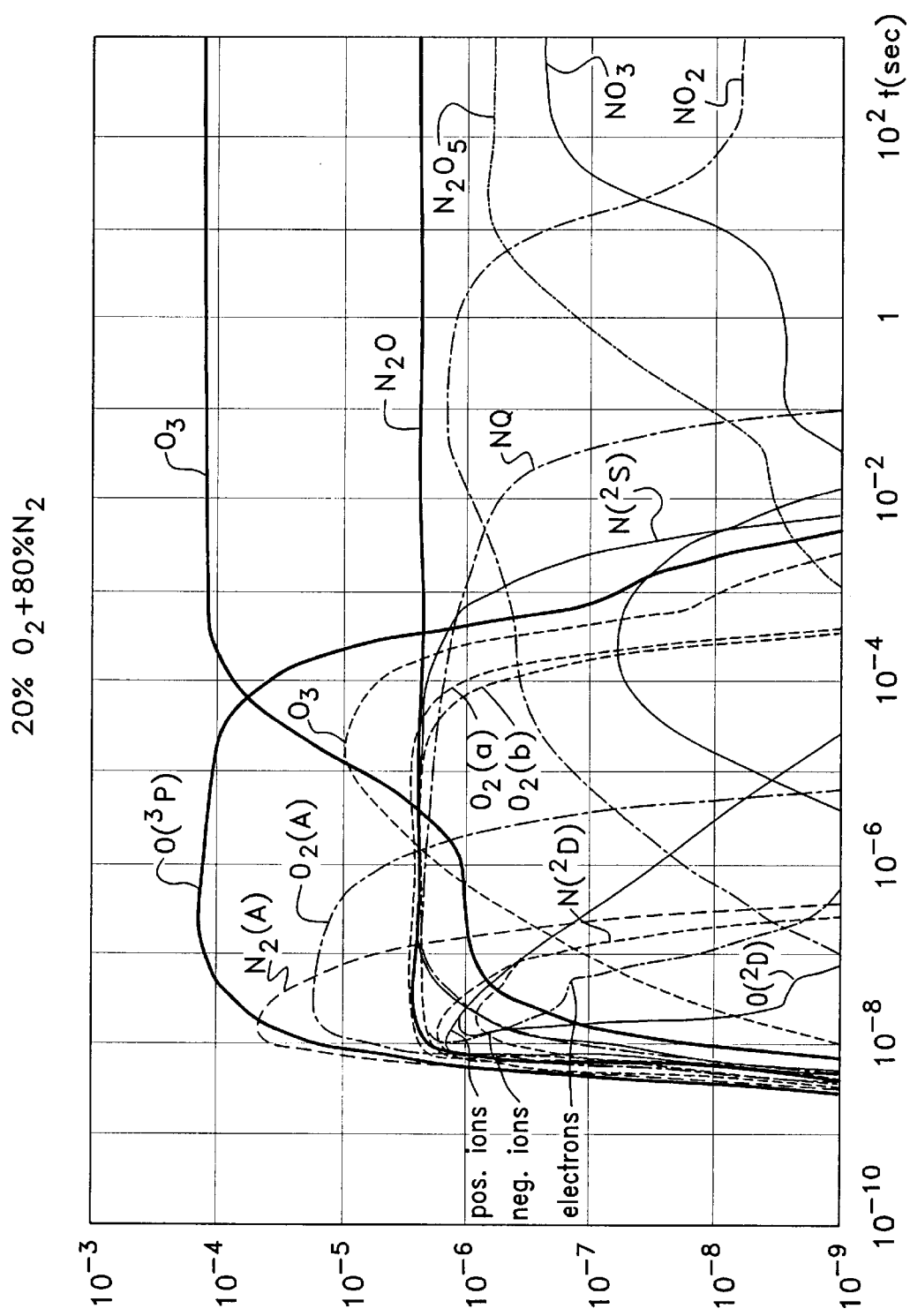
FIG. 14 illustrates the lifetimes of some various reaction products and ion species for a micro discharge modeled in air.

FIG. 14 illustrates the lifetimes of some various reaction products and ion species for a micro discharge modeled in air. Based on this graph, the lifetime of nitrogen dioxide is sufficient to affect a polymer surface external to the treatment zone. If oxygen of even a few percent is present within the discharge chamber, ozone levels will rise, as will nitrogen dioxide levels. A slow treatment will subject a treated surface to increased exposure to the nitrogen dioxide and higher-order oxides. This exposure will reduce the radical concentration on the surface of the treated polymer, degrading lamination peel strength.

Using moderate to high pressures enables fast, uniform deposition of fluorocarbons species onto a polymer surface with reduced capital cost relative to low-pressure plasmas, for applications such as chemical barriers. The present invention provides means for fast deposition at high processing speeds.

(3) Comparison of Pulse Discharge and Corona Discharge Surface Treatments

A study was made to compare surface treatments produced using atmospheric pressure discharge generated by pulsed-voltage excitation with conventional air-fed corona discharge technology using a small Enercon treater which could be used for film treatment. This treater uses ceramic-coated bar-type electrodes excited by a variable frequency (6 kHz to 30 kHz), half-sine-wave signal.

The atmospheric-pressure dielectric-barrier discharge was excited by applying a fast, asymmetric voltage pulse to the cylinder-sleeve electrode geometry of FIG. 2. A pulse-repetition frequency of 10 kHz was typically used. Several different gas mixtures were used to treat linear low-density polyethylene and polypropylene. Treated samples were analyzed using ESCA surface analysis to determine elemental surface concentration of oxygen and nitrogen. The scaling of surface oxygen and nitrogen for the pulsed atmospheric discharge and the Enercon corona-treated surfaces are shown in FIG. 15 and FIG. 16.

Figure 15B:
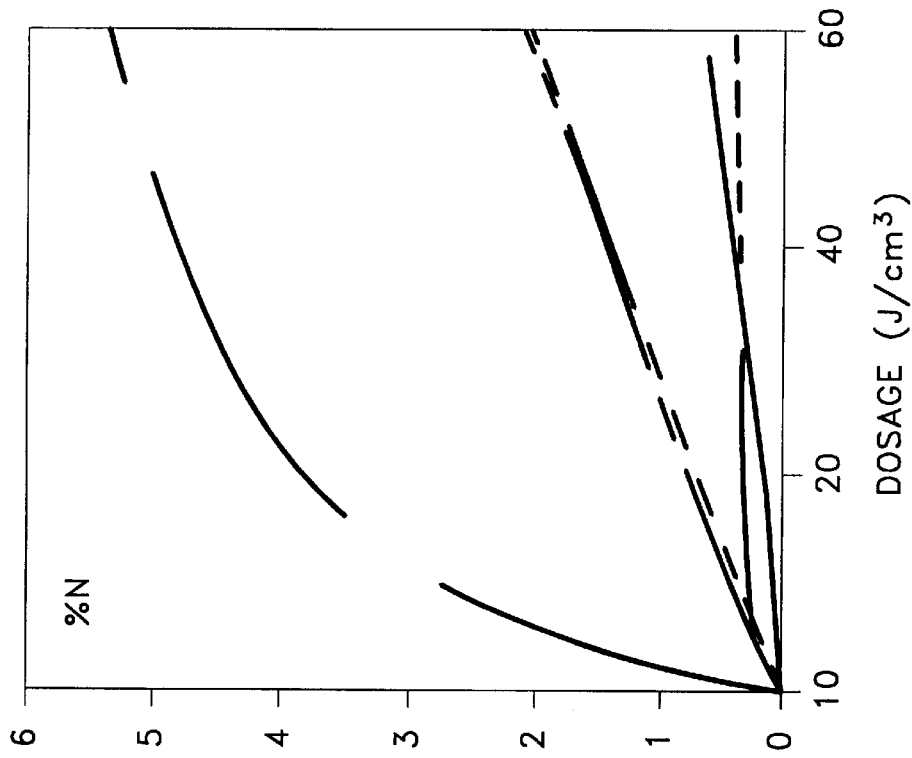
FIG. 15 presents experimental scaling of the surface oxygen and nitrogen deposited on polypropylene film using the cylinder-sleeve electrode geometry with asymmetric pulsed voltage excitation.
Figure 15A:
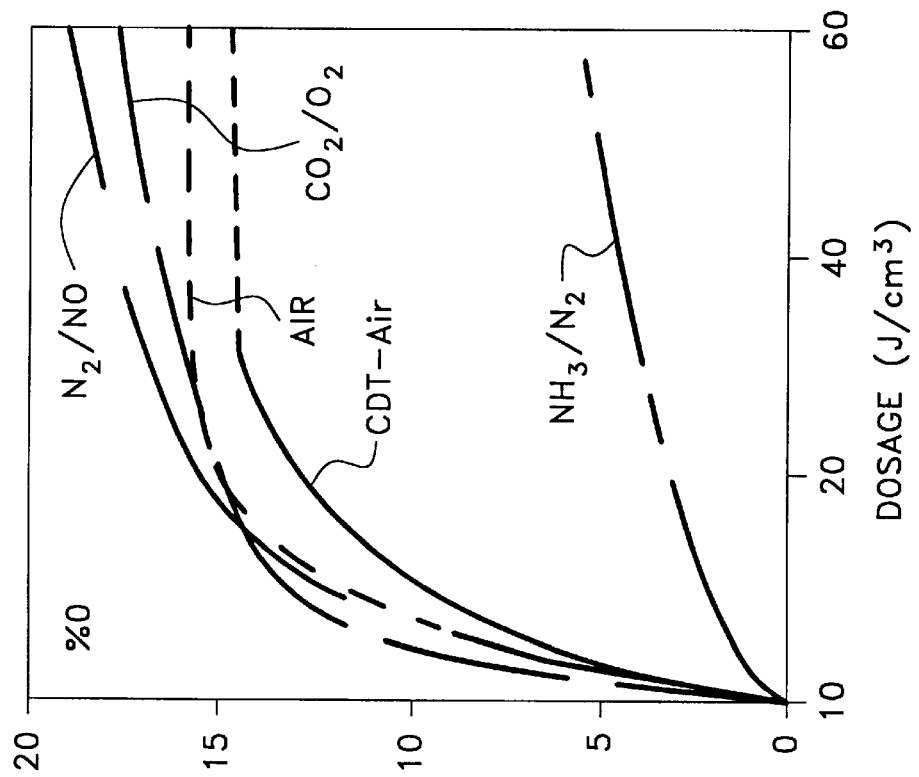
Figure 16B:
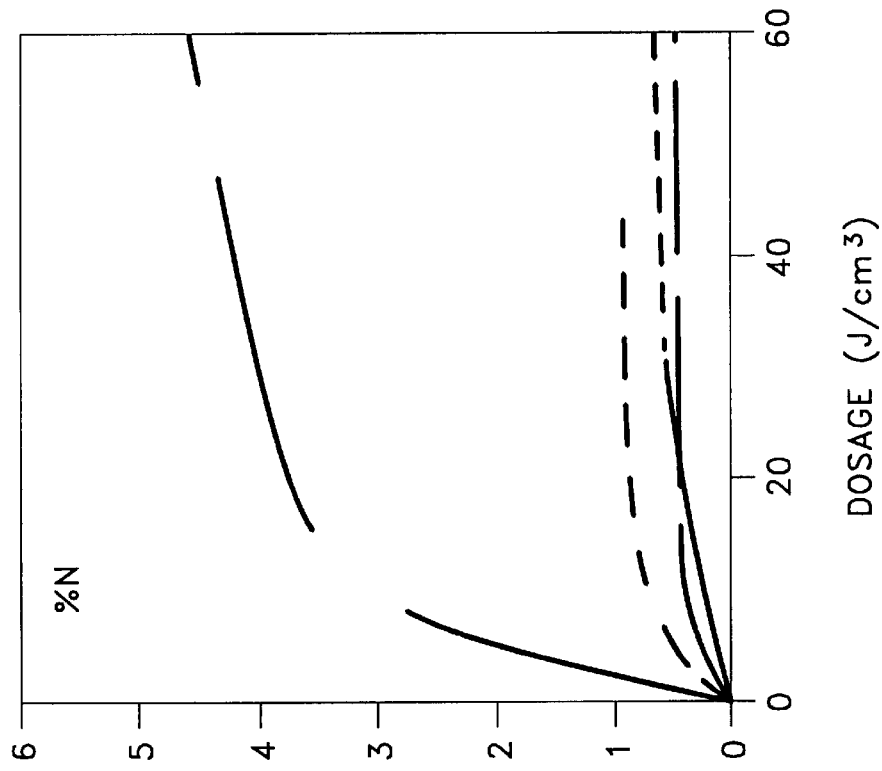
FIG. 16 presents experimental scaling of the surface oxygen and nitrogen deposited on polyethylene film using the cylinder-sleeve electrode geometry with asymmetric pulsed voltage excitation.
Figure 16A:
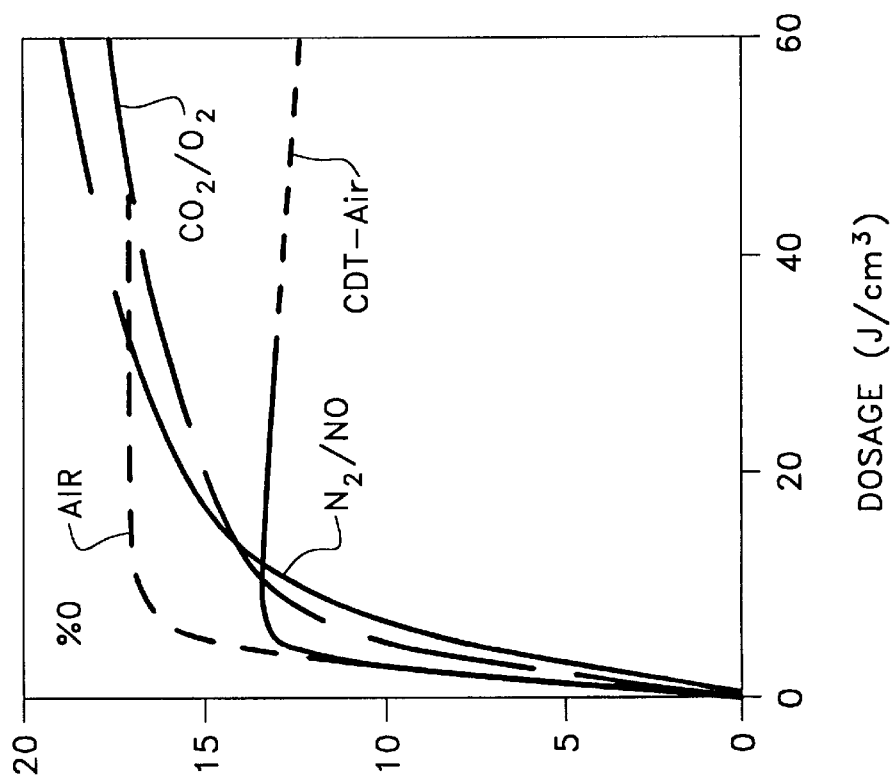

In particular, FIG. 15 and FIG. 16 illustrate the scaling of surface oxygen and nitrogen with treatment dosage on polypropylene and polyethylene films. Treatments with various gases at atmospheric pressure using the electrode geometry in FIG. 2 with asymmetric pulsed voltage excitation are compared to treatments using a commercial corona treater 'CDT' in air. The surface concentrations of oxygen and nitrogen were measured using X-ray photoelectron spectroscopy (XPS) surface analysis. Treatment dosage is the discharge power density times the plasma exposure time. These data illustrate that using air, carbon dioxide+oxygen, or nitrogen+1% nitric oxide, the pulsed dielectric-barrier discharge is capable of producing high concentrations of oxygen on both polymers.

The gas mixture of nitrogen+1% nitric oxide produced significant levels of surface nitrogen on both polypropylene and polyethylene.

(4) Surface Fluorination

Surface fluorination was investigated as a means to increase hydrophobic properties of polymer surfaces and potentially decrease surface friction. Film samples of polypropylene, polyethylene, and PET were first treated in a commercial low-pressure ($P \leq 1$ Torr) system with a gas mixture of argon and perfluoromethane $C_2F_6$ for two minutes. Advancing contact angles of 125 degrees for water were obtained for all three polymers.

Several attempts were made using the present invention to fluorinate film surfaces using a pulsed discharge and an RF discharge at atmospheric pressure with a gas mixture of helium and tetrafluoromethane $CF_4$. These experiments yielded contact angles of 104 to 109 degrees. It was subsequently learned that copper has a high probability for recombination of atomic fluorine, and copper was the material of the upper electrode. Also the presence of only trace amounts of oxygen were sufficient to cause the formation of a hydrophilic surface. Changing to a stainless-steel electrode and increasing the gas flow to offset oxygen infiltration yielded improved results. Table 5 lists treatment conditions and contact angles for the treatment of polyethylene using $He+CF_4$ and $He+C_2F_6$ mixtures.

(5) Polymer Grafting of Acrylic Acid

Polymer grafting using various monomers has been used to produce extremely hydrophilic surfaces. Grafting is normally initiated by the presence of peroxides or peroxy radicals that have been generated on the polymer surface via plasma, UV, or gamma-ray exposure with the monomer applied in a gas or liquid phase. These treatment methods have been effective at producing hydrophilic surfaces, however treatment times are typically measured in minutes.

In an attempt to graft the monomer acrylic acid with short exposure times, a two-step process was configured. A polymer film was first exposed to direct plasma treatment, using the cylinder-sleeve electrode assembly of FIG. 2, to functionalize the surface with oxygen species and radicals. The film was then exposed to plasma species, monomer, and monomer fragments generated by the remote plasma geometry of FIG. 5. Table 6 lists treatment conditions and surface properties for the treatment of polyethylene using two different gas mixtures.

In particular, Table 6 lists plasma treatment conditions used to treat a linear low-density polyethylene film by grafting the monomer acrylic acid onto a pretreated surface. Surface pretreatment was performed using the cylinder-sleeve electrode geometry with a 45 kHz negative-voltage pulse applied to the sleeve electrode. Grafting of acrylic acid was performed by passing a supply gas over the monomer and then introducing the supply gas plus monomer vapor into the cavity of the cylindrical cavity electrode assembly. A resonant RF plasma was excited at 13.56 MHz, and the polymer film translated past the cavity slot. The 10-second exposure sample using a sulfur dioxide-oxygen supply gas, was slightly tacky but did not "block" on the wind-up spool. These examples illustrate the technique's ability to graft the monomer acrylic acid using short exposure times. According to these data, treatment times as short as 2 and 5 seconds produced hydrophilic surfaces with good anti-fog properties.

For organo-sulfur surfaces, RF remote plasma at 50 to 760 torr operated with acrylic acid and $SO_2$ in the plasma leads to a highly wettable, high-tack surface for applications such as adhesion promotion and anti-fog. Plasma deposition is known in the low-pressure regime for species such as acrylic acid but requires several minutes of treatment or special monomer delivery systems. The present invention enables higher speeds, thereby providing a commercially feasible treatment of surfaces. The present invention also provides better control of chemistry due to the reaction being out of the electric field.

(6) Silane Treatments for Anti-Fog Applications

The different silanes have been used for many years by the semiconductor industry to deposit amorphous-silicon and silicon-dioxide layers for dielectric barriers using plasma deposition. The silicon-dioxide-type layers tend to be very hydrophilic and have recently been applied to polymer surfaces. Table 7 and Table 8 list treatment conditions and hydrophilic properties for the treatment of polyethylene film with silicon tetrachloride and dichlorosilane. With short treatment times, very wettable surfaces can be produced with the potential for anti-fog applications.

In particular, Table 7 lists plasma treatment conditions used to coat polyethylene films with a silicon-oxide layer using silicon tetrachloride with nitrous oxide and carbon dioxide as oxidants. These treatments yield a highly hydrophilic surface. From the elemental surface analysis data, surface layers close to silicon dioxide are produced with low levels of chlorine or nitrogen incorporated. Table 8 lists plasma treatment conditions used for treating polyethylene film with dichlorosilane and carbon dioxide to produce a silicon-oxide layer. This treatment produced very hydrophilic surfaces similar to the treatments in Table 7.

The hydride silane $SiH_4$, which is commonly used in the semiconductor industry, yields fast deposition rates when used with a small amount of an oxidizer. This silane is pyrophoric and requires special handling. The chlorine-containing silanes, dichlorosilane ($SiCl_2H_2$) and silicon tetrachloride ($SiCl_4$), are less flammable but more toxic and corrosive. Both $SiCl_2H_2$ and $SiCl_4$ react with air and moisture to produce hydrogen chloride HCl. When used in a plasma discharge, these silanes react completely. Excess flow rates, oxidizer or power densities tend to produce powder deposits rather than film deposits.

For silica-like surfaces, RF direct plasma at 50 to 760 Torr operated with a silane and an oxidant leads to a stable, highly wettable surface with low coefficient of friction for applications such as adhesion promotion and anti-fog. RF direct plasma treatment at moderate to high pressures will be cheaper than the prior-art, low-pressure plasma treatment, and may have faster deposition rates capable of being used in processes having faster speeds. The present invention may also provide much rougher surfaces having lower coefficient of friction and better machinability. RF direct plasma at 20–800 torr will put down a more homogeneous coating and have greater deposition rates. It is likely that any volatile silicon ($SiX_yH_z$, where X=Cl, F, Br, and where y+z=4) with any volatile oxidant (e.g., $O_2$, NO, $N_2O$, $NO_2$, $N_2O_4$, CO, $CO_2$, $SO_2$) will be produce a silica-like surface under plasma. Adhesion, deposition rate, homogeneity, wettability and roughness will vary based on the particular apparatus used.

(7) Treatment of Web Substrates

Fibrous web substrates, either woven or nonwoven, can also be effectively treated using either discharge technique. Nonwoven substrates made from the relatively inert polymers of polypropylene or polyethylene are good candidates for the surface modification available using the plasma discharge methods disclosed. Spunbond polypropylene has widespread use in applications requiring absorbency. Topical surfactants have traditionally been used to render polypropylene webs hydrophilic. Surfactants, however, provide limited wettability in that they tend to be degraded or removed with rinsing and cannot withstand certain chemical environments. Environmental concerns are also beginning to place restrictions on the use of surfactants with this type of substrate since nonwovens are often used with disposable products. Chemical additives called melt additives, which are added to a polymer base prior to the melting and extrusion process, can also produce hydrophilic surfaces. These products rely either on the mobile or migratory properties of a polymer that allow the additive to "bloom" to the surface with time, or the rheological processes involved during extrusion that allow some of the additive to remain on the polymer surface. Relying on the migratory properties of the polymer tends to produce a surface that alters with time, and control of the extrusion process is difficult.

Plasma surface treatment can produce durable surface treatments. Tables 9 and 10 list performance data for a 20 gr/m² polypropylene, spunbond treated using the RF resonant discharge at a reduced pressure of ~55 Torr.

Table 9 illustrates the excellent performance of treatments using dichlorosilane and silicon tetrachloride with small amounts of an oxidizer present. The wetting performance is listed by the number of water droplets absorbed at 0.1 second, 0.5 second, and 5 seconds out of ten droplets placed randomly on a sample. Only after a rinsing in distilled water did the performance of the dichlorosilane-treated samples degrade. All droplets were, however, still absorbed within five seconds. The silicon tetrachloride samples had excellent wettability and could probably be treated with an even lower dosage.

Table 10 lists performance data for the same 20 gr/m² polypropylene, spunbond treated using sulfur dioxide, nitrogen, and an oxidant. Although these samples do not have the rapid wettability performance of the silane-treated samples, they still exhibit rewetting following a vigorous rinsing in warm (~43° C.) water. Some yellowing and odor were present on the treated samples. Water rinsing removed any residue and the discoloration.

Successful plasma treatment of polypropylene web substrates relies in part on controlling the beta chain scission process that occurs with polypropylene due to the presence of ultraviolet radiation and using a surface functionalization that is resistant to migration. Silicon tetrachloride and dichlorosilane are highly reactive and appear to produce highly polar groupings or matrices on the polymer surface that are resistant to migration. The sulfur dioxide treatments seem to produce large functionalities such as SOOOH groups which also tend to be resistant to migration due to their size. Some degree of polymer cross linking is also occurring with plasma exposure. This reduces surface migration of the polar groups by fixing or chaining the surface polymer matrix.

Comparison of Discharge Technologies

As described in earlier sections, high-pressure plasma treatment of film substrates uses one or more electrode structures excited by either a high-voltage asymmetric pulsed voltage or a high-frequency resonant RF signal. The electrode designs are capable of generating uniform well-defined, high-power-density plasma discharges over the pressure range from about 10 Torr to about 1 Atmosphere. The asymmetric voltage excitation can be used with essentially any gas at atmospheric pressure. For the resonant RF excitation, a buffer gas, typically helium, and a few to several percent of a working gas are used to operate at atmospheric pressure. Reduced-pressure operation, however, allows the resonant RF discharge to be generated with a wide variety of gas mixtures. Reduced-pressure operation also allows significant savings with the use of specialty gases. Both excitation methods can produce power densities greater than the low-frequency ($f \leq 30$ kHz) sinusoidal excitation used in conventional corona treaters.

Table 11 summarizes the operating parameters of the discharge techniques of the present invention as compared to conventional corona-discharge technology. Due in part to the high duty cycle obtained with the resonant RF discharge technique, power densities ten to a hundred times higher than pulse discharges or corona discharges can be obtained. At atmospheric-pressure operation, this method requires heavy use of an inert gas such as argon or helium. Reducing the operating pressure to 150 Torr or less allows the discharge technique to be used with essentially any gas mixture. The pulse discharge and corona discharge operate at atmospheric pressure with essentially any gas, but with lower power densities. The pulse discharge produces plasma power densities higher than the corona discharge, and allows some control over which plasma species bombard the substrate.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A continuous-feed plasma treater system, comprising:
   (a) an enclosure;
   (b) one or more electrode assemblies housed within the enclosure;
   (c) a pressure control system adapted to control the pressure of a working gas within the enclosure within a range from about 10 Torr to about 200 Torr; and
   (d) an RF power supply adapted to excite at least one of the electrode assemblies in an RF resonant excitation mode to generate a plasma within the enclosure for exposure to a substrate.

2. The invention of claim 1, wherein the system is adapted to operate at a rough vacuum pressure within the enclosure.

3. The invention of claim 1, wherein the RF power supply is adapted to excite the electrode assembly with a sinusoidal voltage output having a frequency range of about 1 MHz to about 82 MHz with a voltage amplitude of about 100 volts or greater.

4. The invention of claim 1, wherein the pressure control system comprises:
   (1) a vacuum system adapted to regulate the pressure in the enclosure; and
   (2) a gas supply system for supplying the working gas to the enclosure.

5. The invention of claim 4, wherein the pressure control system further comprises a gas recovery system for recovering the working gas from the enclosure.

6. The invention of claim 5, wherein the gas recovery system is adapted to reuse at least some of the recovered working gas for the plasma medium.

7. The invention of claim 5, wherein the gas recovery system is adapted to use at least some of the recovered working gas to purge the substrate prior to or after exposure to the plasma.

8. The invention of claim 5, wherein the gas recovery system comprises means for reducing the moisture content of the recovered working gas.

9. The invention of claim 1, further comprising one or more roller-seal assemblies forming part of the enclosure and adapted to enable the substrate to enter or exit the enclosure and to inhibit gases from entering or exiting the enclosure.

10. The invention of claim 9, wherein each roller-seal assembly comprises a plurality of rollers forming a cavity that is adapted to be evacuated by the vacuum system to a pressure less than the pressure inside the enclosure such that, when the pressure within the cavity is maintained less than the pressure inside the enclosure, leakage of ambient air into the enclosure is further inhibited.

11. The invention of claim 10, further comprising wiper seals positioned against one or more of the rollers.

12. The invention of claim 1, further comprising a secondary enclosure adapted to receive the substrate after being exposed to the plasma, wherein the secondary enclosure is adapted to be purged with an inert gas to inhibit post-treatment reactions between the treated substrate and ambient air.

13. The invention of claim 1, wherein one of the electrode assemblies is a cylinder-sleeve electrode assembly comprising a cylinder electrode and a sleeve electrode having a concave face positioned facing and substantially parallel to the cylinder electrode to form an annular gap between the outer surface of the cylinder electrode and the inner surface of the sleeve electrode, the annular gap forming a primary plasma discharge zone.

14. The invention of claim 1, wherein one of the electrode assemblies is a cylindrical cavity electrode assembly comprising:
   a cavity electrode, having a cylindrical bore and a wall slot running parallel to the cylindrical bore and exposing the cylindrical bore;
   a cylinder electrode positioned within the cylindrical bore of the cavity electrode to form an annular gap between the outer surface of the cylinder electrode and the surface of the cylindrical bore, the annular gap forming a primary plasma discharge zone; and
   a treater drum positioned adjacent to the wall slot of the cavity electrode, wherein, during operations, the substrate is translated past the wall slot on the treater drum and exposed to plasma species that are convected from the primary plasma discharge zone to the wall slot.

15. The invention of claim 14, wherein the cavity electrode comprises two pieces electrically connected by a shunt inductor.

16. The invention of claim 1, wherein the RF power supply is connected to a network formed by a shunt inductor L connected to the electrode assembly so as to form a resonant LC circuit where the capacitance C is the effective capacitance of the electrode assembly.

17. The invention of claim 16, wherein the shunt inductor is a variable inductor.

18. The invention of claim 17, wherein, during operations, the shunt inductor is adjusted so that the resonant frequency of the LC circuit is approximately the same as the frequency of the sinusoidal voltage.

19. The invention of claim 1, wherein the RF power supply comprises an impedance matching transformer adapted to convert an unbalanced output from the RF power supply into a balanced output.

20. The invention of claim 19, wherein the RF power supply further comprises a balanced pi-matching network to match the balanced output impedance of the impedance matching transformer to the impedance of the electrode assembly.

21. The invention of claim 1, wherein the power supply is configured to generate an initiating electric field to initiate a plasma discharge and a weaker sustaining electric field to sustain the initiated plasma discharge.

22. A method for treating a substrate with a continuous-feed plasma treater system, comprising the steps of:
   (a) controlling the pressure of a working gas within an enclosure of the system within a range from about 10 Torr to about 200 Torr;
   (b) exciting one or more electrode assemblies housed within the enclosure in an RF resonant excitation mode to generate a plasma from the working gas; and
   (c) exposing the substrate to the plasma within the enclosure to treat the substrate.

23. The method of claim 22, wherein a vapor or liquid monomer is deposited on the substrate after plasma pretreatment and then exposed to at least one of UV and plasma species generated by a cylindrical cavity electrode assembly.

24. The method of claim 22, wherein:
   the enclosure comprises a cylinder-sleeve electrode assembly and a cylindrical cavity electrode assembly, wherein the cylindrical cavity electrode assembly is excited using the RF resonant excitation mode;
   a surface of the substrate is pre-treated by exposing the substrate to a first plasma generated by exciting a first working gas using the cylinder-sleeve electrode assembly; and a grafting substance is grafted onto the pre-treated surface of the substrate by exposing the pre-treated substrate to a second plasma generated by exciting a second working gas using the cylindrical cavity electrode assembly.

25. The method of claim 24, wherein:

the substrate is a linear low-density polyethylene film;

the grafting substance is a monomer acrylic acid;

the first working gas is one of $CO_2$, $N_2O$, and $O_2$;

the cylinder-sleeve electrode assembly is excited using either an asymmetric pulsed voltage or a resonant RF voltage; and the second working gas is generated by passing a supply gas over the monomer acrylic acid, the supply gas being one of $SO_2$, $O_2$, and $CO_2$.

26. The method of claim 22, wherein:

the enclosure comprises a cylinder-sleeve electrode assembly excited using the RF resonant excitation mode; and surface additives are removed from the substrate by exposing the substrate to the plasma generated by exciting the working gas using the cylinder-sleeve electrode assembly.

27. The method of claim 26, wherein:

the substrate is a polyolefin-based film; and the working gas is a combination of $CF_4$ and $O_2$.

28. The method of claim 26, wherein:

the substrate is a polyolefin-based film; and the working gas is a combination of $SF_6$ and $O_2$ or $NF_3$ and $O_2$.

29. The method of claim 22, wherein:

the enclosure comprises a cylinder-sleeve electrode assembly excited using the RF resonant excitation mode; and a layer is added to the substrate by exposing the substrate to the plasma generated by exciting the working gas using the cylinder-sleeve electrode assembly.

30. The method of claim 29, wherein:

the substrate is a polyethylene film;

the working gas comprises $SiCl_4$ and at least one of $N_2$, $N_2O$, and $CO_2$; and the layer is a silicon-oxide layer.

31. The method of claim 29, wherein:

the substrate is a polyethylene film;

the working gas comprises $SiCl_2H_2$ and at least one of $N_2$, $CO_2$, and $O_2$; and the layer is a silicon-oxide layer.

32. The method of claim 29, wherein:

the substrate is a polyethylene film;

the working gas comprises $SiH_4$ and at least one of $N_2$, $CO_2$, and $O_2$; and the layer is a silicon-oxide layer.

33. The method of claim 22, wherein:

the enclosure comprises two or more cylinder-sleeve electrode assemblies excited using the RF resonant excitation mode;

one side of a first substrate is treated by exposing the first substrate to a first plasma generated by exciting a first working gas using one cylinder-sleeve electrode assembly;

one side of a second substrate is treated by exposing the second substrate to a second plasma generated by exciting a second working gas using the other cylinder-sleeve electrode assembly; and the first and second substrates are merged with treated sides facing one another to form a laminated material.

34. The method of claim 33, wherein:

each of the first and second substrates is a polyethylene film with ethylene vinyl acetate on the plasma-exposed side; and the working gas comprises $N_2/NO$.

35. A continuous-feed plasma treater system for treating a substrate, comprising:

(a) means for controlling the pressure of a working gas within an enclosure of the system within a range from about 10 Torr to about 200 Torr;

(b) means for exciting one or more electrode assemblies housed within the enclosure in an RF resonant excitation mode to generate a plasma from the working gas; and (c) means for exposing the substrate to the plasma within the enclosure to treat the substrate.

36. A continuous-feed plasma treater system, comprising:

(a) an enclosure;

(b) one or more electrode assemblies housed within the enclosure;

(c) a pressure control system adapted to control the pressure of a working gas within the enclosure within a range from about 10 Torr to about 200 Torr; and (d) a power supply adapted to excite at least one of the electrode assemblies in a pulsed voltage excitation mode to generate a plasma within the enclosure for exposure to a substrate.

37. The invention of claim 36, wherein the system is adapted to operate at a rough vacuum pressure within the enclosure.

38. The invention of claim 36, wherein the power supply is adapted to excite the electrode assembly with an asymmetric pulsed voltage having a pulse repetition rate of about 1 kHz to about 100 kHz, a pulse rise time of about 1 microsecond or less, a pulse length of about 1 to about 30 microseconds, and a pulse amplitude of about 100 volts or greater.

39. The invention of claim 36, wherein the pressure control system comprises:

(1) a vacuum system adapted to regulate the pressure in the enclosure; and (2) a gas supply system for supplying the working gas to the enclosure.

40. The invention of claim 39, wherein the pressure control system further comprises a gas recovery system for recovering the working gas from the enclosure.

41. The invention of claim 40, wherein the gas recovery system is adapted to reuse at least some of the recovered working gas for the plasma medium.

42. The invention of claim 40, wherein the gas recovery system is adapted to use at least some of the recovered working gas to purge the substrate prior to or after exposure to the plasma.

43. The invention of claim 40, wherein the gas recovery system comprises means for reducing the moisture content of the recovered working gas.

44. The invention of claim 36, further comprising one or more roller-seal assemblies forming part of the enclosure and adapted to enable the substrate to enter or exit the enclosure and to inhibit gases from entering or exiting the enclosure.

45. The invention of claim 44, wherein each roller-seal assembly comprises a plurality of rollers forming a cavity that is adapted to be evacuated by the vacuum system to a pressure less than the pressure inside the enclosure such that, when the pressure within the cavity is maintained less than the pressure inside the enclosure, leakage of ambient air into the enclosure is further inhibited.

46. The invention of claim 45, further comprising wiper seals positioned against one or more of the rollers.

47. The invention of claim 36, further comprising a secondary enclosure adapted to receive the substrate after being exposed to the plasma, wherein the secondary enclosure is adapted to be purged with an inert gas to inhibit post-treatment reactions between the treated substrate and ambient air.

48. The invention of claim 36, wherein one of the electrode assemblies is a cylinder-sleeve electrode assembly comprising a cylinder electrode and a sleeve electrode having a concave face positioned facing and substantially parallel to the cylinder electrode to form an annular gap between the outer surface of the cylinder electrode and the inner surface of the sleeve electrode, the annular gap forming a primary plasma discharge zone.

49. The invention of claim 36, wherein one of the electrode assemblies is a cylindrical cavity electrode assembly comprising:
  a cavity electrode, having a cylindrical bore and a wall slot running parallel to the cylindrical bore and exposing the cylindrical bore;
  a cylinder electrode positioned within the cylindrical bore of the cavity electrode to form an annular gap between the outer surface of the cylinder electrode and the surface of the cylindrical bore, the annular gap forming a primary plasma discharge zone; and
  a treater drum positioned adjacent to the wall slot of the cavity electrode, wherein, during operations, the substrate is translated past the wall slot on the treater drum and exposed to plasma species that are convected from the primary plasma discharge zone to the wall slot.

50. The invention of claim 49, wherein the cavity electrode comprises two pieces electrically connected by a shunt inductor.

51. The invention of claim 36, wherein the power supply is configured to generate an initiating electric field to initiate a plasma discharge and a weaker sustaining electric field to sustain the initiated plasma discharge.

52. A method for treating a substrate with a continuous-feed plasma treater system, comprising the steps of:
  (a) controlling the pressure of a working gas within an enclosure of the system within a range from about 10 Torr to about 200 Torr;
  (b) exciting one or more electrode assemblies housed within the enclosure in a pulsed voltage excitation mode to generate a plasma from the working gas; and
  (c) exposing the substrate to the plasma within the enclosure to treat the substrate.

53. The method of claim 52, wherein:
  the enclosure comprises a cylinder-sleeve electrode assembly and a cylindrical cavity electrode assembly, the cylinder-sleeve electrode assembly being excited using the pulsed voltage excitation mode;
  a surface of the substrate is pre-treated by exposing the substrate to a first plasma generated by exciting a first working gas using the cylinder-sleeve electrode assembly; and
  a grafting substance is grafted onto the pre-treated surface of the substrate by exposing the pre-treated substrate to a second plasma generated by exciting a second working gas using the cylindrical cavity electrode assembly.

54. The method of claim 53, wherein:
  the substrate is a linear low-density polyethylene film;
  the grafting substance is a monomer acrylic acid;
  the first working gas is one of $CO_2$, $N_2O$, and $O_2$;
  the second working gas is generated by passing a supply gas over the monomer acrylic acid, the supply gas being one of $SO_2$, $O_2$, and $CO_2$; and
  the cylindrical cavity electrode assembly is excited using an RF-resonant voltage.

55. The method of claim 52, wherein:
  the enclosure comprises a cylinder-sleeve electrode assembly excited using the pulsed voltage excitation mode; and
  a layer is added to the substrate by exposing the substrate to the plasma generated by exciting the working gas using the cylinder-sleeve electrode assembly.

56. The method of claim 55, wherein:
  the substrate is a polyethylene film;
  the working gas comprises $SiCl_4$ and at least one of $N_2$, $N_2O$, and $CO_2$; and
  the layer is a silicon-oxide layer.

57. The method of claim 55, wherein:
  the substrate is a polyethylene film;
  the working gas comprises $SiCl_2H_2$ and at least one of $N_2$, $CO_2$, and $O_2$; and
  the layer is a silicon-oxide layer.

58. The method of claim 55, wherein:
  the substrate is a polyethylene film;
  the working gas comprises $SiH_4$ and at least one of $N_2$, $CO_2$, and $O_2$; and
  the layer is a silicon-oxide layer.

59. A continuous-feed plasma treater system for treating a substrate, comprising:
  (a) means for controlling the pressure of a working gas within an enclosure of the system within a range from about 10 Torr to about 200 Torr;
  (b) means for exciting one or more electrode assemblies housed within the enclosure in a pulsed voltage excitation mode to generate a plasma from the working gas; and
  (c) means for exposing the substrate to the plasma within the enclosure to treat the substrate.

60. A continuous-feed plasma treater system, comprising:
  (a) an enclosure;
  (b) one or more electrode assemblies housed within the enclosure;
  (c) a pressure control system adapted to control the pressure of a working gas within the enclosure within a range from about 10 Torr to about 1 Atmosphere;
  (d) an RF power supply adapted to excite at least one of the electrode assemblies in an RF resonant excitation mode to generate a plasma within the enclosure for exposure to a substrate; and
  (e) one or more roller-seal assemblies forming part of the enclosure and adapted to enable the substrate to enter or exit the enclosure and to inhibit gases from entering or exiting the enclosure.

61. The invention of claim 60, wherein each roller-seal assembly comprises a plurality of rollers forming a cavity that is adapted to be evacuated by the vacuum system to a pressure different from the pressure inside the enclosure such that, when the pressure within the cavity is maintained less than the pressure inside the enclosure, leakage of ambient air into the enclosure is further inhibited.

62. A continuous-feed plasma treater system, comprising:
(a) an enclosure;
(b) one or more electrode assemblies housed within the enclosure;
(c) a pressure control system adapted to control the pressure of a working gas within the enclosure within a range from about 10 Torr to about 1 Atmosphere; and
(d) an RF power supply adapted to excite at least one of the electrode assemblies in an RF resonant excitation mode to generate a plasma within the enclosure for exposure to a substrate, wherein one of the electrode assemblies is a cylindrical cavity electrode assembly comprising:

a cavity electrode, having a cylindrical bore and a wall slot running parallel to the cylindrical bore and exposing the cylindrical bore;

a cylinder electrode positioned within the cylindrical bore of the cavity electrode to form an annular gap between the outer surface of the cylinder electrode and the surface of the cylindrical bore, the annular gap forming a primary plasma discharge zone; and a treater drum positioned adjacent to the wall slot of the cavity electrode, wherein, during operations, the substrate is translated past the wall slot on the treater drum and exposed to plasma species that are convected from the primary plasma discharge zone to the wall slot.

63. The invention of claim 62, wherein the cavity electrode comprises two pieces electrically connected by a shunt inductor.

64. A continuous-feed plasma treater system, comprising:
(a) an enclosure;
(b) one or more electrode assemblies housed within the enclosure;
(c) a pressure control system adapted to control the pressure of a working gas within the enclosure within a range from about 10 Torr to about 1 Atmosphere; and
(d) an RF power supply adapted to excite at least one of the electrode assemblies in an RF resonant excitation mode to generate a plasma within the enclosure for exposure to a substrate, wherein the RF power supply is connected to a network formed by a shunt inductor L connected to the electrode assembly so as to form a resonant LC circuit where the capacitance C is the effective capacitance of the electrode assembly.

65. The invention of claim 64, wherein the shunt inductor is a variable inductor.

66. A continuous-feed plasma treater system, comprising:
(a) an enclosure;
(b) one or more electrode assemblies housed within the enclosure;
(c) a pressure control system adapted to control the pressure of a working gas within the enclosure within a range from about 10 Torr to about 1 Atmosphere; and
(d) a power supply adapted to excite at least one of the electrode assemblies in a pulsed voltage excitation mode to generate a plasma within the enclosure for exposure to a substrate, wherein one of the electrode assemblies is a cylindrical cavity electrode assembly comprising:

a cavity electrode, having a cylindrical bore and a wall slot running parallel to the cylindrical bore and exposing the cylindrical bore;

a cylinder electrode positioned within the cylindrical bore of the cavity electrode to form an annular gap between the outer surface of the cylinder electrode and the surface of the cylindrical bore, the annular gap forming a primary plasma discharge zone; and a treater drum positioned adjacent to the wall slot of the cavity electrode, wherein, during operations, the substrate is translated past the wall slot on the treater drum and exposed to plasma species that are convected from the primary plasma discharge zone to the wall slot.

67. The invention of claim 66, wherein the cavity electrode comprises two pieces electrically connected by a shunt inductor.

* * * * *